United States Patent [19]
Urano et al.

[11] Patent Number: 6,033,826
[45] Date of Patent: *Mar. 7, 2000

[54] POLYMER AND RESIST MATERIAL

[75] Inventors: Fumiyoshi Urano, Niiza; Hirotoshi Fujie, Kawagoe; Keiji Oono, Sakado, all of Japan

[73] Assignee: Wako Pure Chemical Industries, Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/769,530

[22] Filed: Dec. 19, 1996

[30] Foreign Application Priority Data

Feb. 9, 1996 [JP] Japan .................................. 8-047955
Jun. 7, 1996 [JP] Japan .................................. 8-168387

[51] Int. Cl.$^7$ .............................. G03F 7/004; C08C 33/04
[52] U.S. Cl. .................. 430/270.1; 430/905; 525/210; 525/216; 525/219; 525/221; 525/238
[58] Field of Search ................. 430/270.1, 905; 525/210, 216, 219, 221, 238

[56] References Cited

U.S. PATENT DOCUMENTS

| | | | |
|---|---|---|---|
| 5,350,660 | 9/1994 | Urano et al. | 430/270.1 |
| 5,352,564 | 10/1994 | Takeda et al. | |
| 5,468,589 | 11/1995 | Urano et al. | 430/270.1 |
| 5,558,971 | 9/1996 | Urano et al. | 430/270.1 |
| 5,627,006 | 5/1997 | Urano et al. | 430/270.1 |

FOREIGN PATENT DOCUMENTS

| | | |
|---|---|---|
| 0 520 642 | 12/1992 | European Pat. Off. . |
| 0 588 544 A2 | 3/1994 | European Pat. Off. . |
| 0 679 951 A1 | 11/1995 | European Pat. Off. . |

*Primary Examiner*—John S. Chu
*Attorney, Agent, or Firm*—Armstrong, Westerman, Hattori, McLeland & Naughton

[57] ABSTRACT

A polymer of polyhydroxystyrene derivative containing an acetal or ketal group which can easily be eliminated in the presence of an acid in the molecule and having a very narrow molecular weight distribution gives a resist material suitable for forming ultrafine patterns excellent in resolution, heat resistance, mask linearity, and other properties without causing problems of delay time and the like.

11 Claims, 6 Drawing Sheets

POLYMER AND RESIST MATERIAL

BACKGROUND OF THE INVENTION

This invention relates to a polyhydroxystyrene derivative having in its molecule acetal groups or ketal groups which can easily be eliminated in the presence of an acid, particularly to a polyhydroxystyrene derivative having a narrow molecular weight distribution and useful as a functional polymer in a resist material.

With a recent trend toward higher-density integration of semiconductor devices, energy sourses used for finer processing, particularly for light exposure devices used for photolithography are shortened in wavelengths more and more. Now, the use of deep ultraviolet light (300 nm or less), KrF excimer laser beams (248.4 nm), and the like is studied. But there has been found no resist material practically suitable for such wavelengths.

For example, as a resist material usable for a light source of KrF excimer laser beams and deep ultraviolet light, it is required to have high transmittance and high sensitivity for a light near 248.4 nm. From this point of view, it is impossible to use known novolac resins due to poor light transmittance and known dissolution-inhibiting type resist materials due to low sensitivity. Recently, as a resin having high light transmittance, polyvinyl phenols and derivatives thereof have been proposed and used. Further, there have been proposed chemically amplified type resist materials which have high sensitivity and use an acid generated by exposure to light as a medium (H, Ito et al, Polym. Eng, Sci., 23, 1012 (1983); U.S. Pat. No. 4,491,628 to H. Ito et al (=JP-A-2-27660); U.S. Pat. No. 4,603,101 to J. C. Crivello et al (=JP-A-62-115440); JP-A-2-25850; Y. Jian et al, Polym. Mater. Sin & Eng. 66, 41 (1992), etc.).

But, when the polymers disclosed in these references are, for example, phenol ether polymers such as poly(p-tert-butoxycarbonyloxystyrene), poly(p-tert-butoxystyrene), poly(p-tert-butoxycarbonyloxy-α-methylstyrene), poly(p-tert-butoxy-α-methylstyrene), poly(tert-butyl p-isopropenylphenoxyacetate), poly(p-tert-butoxycarbonyloxystyrene/sulfone), poly(p-tetrahydropyranyloxystyrene), poly{p-(1-methoxyethoxy)styrene}, poly{p-(1-phenoxyethoxy)styrene}, etc., films produced are easily peeled off due to poor adhesiveness to a substrate at a time of development, resulting in failing to obtain a good pattern with high heat resistance. In the case of a carboxylic acid-based polymer, for example, poly(tert-butyl p-vinylbenzoate) or poly(tetrahydropyranyl p-vinylbenzoate), resolution is not good due to insufficient light transmittance near 248.4 nm caused by a benzoyl group. Further, in the case of poly(tert-butyl methacrylate), there are problems of poor heat resistance of the polymer and poor resistance to dry etching.

Recently, various chemically amplified resist materials overcoming the above-mentioned disadvantages have been reported: for example, a resist material using a poly(p-tert-butoxycarbonyloxystyrene/p-hydroxystyrene) (JP-A-2-209977, and JP-A-3-206458); a resist material using a poly(p-tetrahydropyranyloxystyrene/p-hydroxystyrene) (JP-A-2-19847, JP-A-2-161436, and JP-A-3-83063); and a resist material using a poly(p-tert-butoxystyrene/p-hydroxystyrene) (JP-A-2-62544, JP-A-4-211258=U.S. Pat. No. 5,350,660). But the resist materials using such polymers as mentioned above have problems of a delay time and substrate dependency. The problem of delay time is a problem of variation of pattern size or deterioration of pattern shape during a period from resist coating to exposure to actinic radiation, or a period from exposure to actinic radiation to heat treatment (PEB) due to a circumstance atmosphere of an amine or the like or an insufficient solvent holding ability. The problem of substrate dependency is a problem of capable of forming or incapable of forming a pattern depending on the material used for a semiconductor substrate, for example, $SiO_2$, $Si_3N_4$, $Ti_3N_4$, $SiO_2$ added with boron (B) and phosphorus (P) (BPSG), or polysilicon.

On the other hand, there are proposed resist materials comprising a polymer introducing an acetal group and ketal group as a protecting group thereinto [e.g. poly(p-1-methoxy-1-methylethoxystyrene/p-hydroxystyrene)] and as a photoacid generator a triphenylsulfonium salt derivative or a diphenyliodonium salt (JP-A-2-161436, JP-A-4-219757, JP-A-5-281745 and JP-A-3-282550). But these materials have a problem of generation of scum (a residue generated at the time of development) which brings about a problem of tramsfer to an underlying substrate by etching, and problems of substrate dependency and delay time. Further, JP-A-5-249682 discloses a resist material comprising a polymer such as poly(p-1-ethoxyethoxystyrene/p-hydroxystyrene), poly(p-1-methoxyethoxystyrene/p-hydroxystyrene), poly(p-1-methoxy-1-methylethoxystyrene/p-hydroxystyrene), poly(p-1-ethoxyethoxystyrene/p-hydroxystyrene/methyl methacrylate) or poly(p-1-ethoxyethoxystyrene/p-hydroxystyrene/fumaronitrile), and a photoacid generator such as a diazodisulfone compound. Such a resist material is excellent in resolution, without a problem in delay time, but has problems in the substrate dependency, heat resistance, roughness of side walls of pattern, and generation of scums. In addition, JP-A-6-194842 discloses a resist material comprising a polymer such as poly(p-1-ethoxyethoxystyrene/p-hydroxystyrene/p-tert-butoxystyrene) and an acid generator such as a diazodisulfone compound. Such a resist material is excellent in resolution, mask linearity, heat resistance, without a problem in delay time, but have problems in the substrate dependency and generation of scum.

In order to solve a problem of dissolution speed difference at the time of development, there are reported resist materials comprising a polymer controlling molecular weight distribution [e.g. a monodisperse polymer such as poly(p-tert-butoxystyrene), poly(p-tetrahydropyranyloxystyrene/p-hydroxystyrene), poly(p-tert-butoxycarbonyloxystyrene/p-hydroxystyrene), poly(p-tert-butoxycarbonyloxystyrene/styrene/p-hydroxystyrene), etc.] and a triphenylsulfonium salt (e.g. JP-A-6-273934, JP-A-6-49134, JP-A-4-195138, JP-A-5-132513, JP-A-7-268030, etc.). But these resist materials using the monodisperse polymers have also the problems of poor resolution, delay time and substrate dependency like the above-mentioned resist materials, since the group eliminated by the acid is a tert-butyl group, a tert-butoxycarbonyl group, a tetrahydropyranyl group, etc. which are also used in the above-mentioned resist materials.

As mentioned above, chemically amplified type resist materials now present cannot be used practically, since there are many problems such as poor heat resistance of the polymer used as a major component, poor adhesiveness to the substrate, poor light transmittance near 248.4 nm, poor solvent holding ability, insufficient chemically amplifying action, insufficient resolution caused by non-uniform developing speed at the time of development, changes of pattern size and pattern shape with the lapse of time (so-called "a problem in delay time"), poor storage stability, poor focus margin, poor mask linearity, footing (broader bottoms in a pattern) and retention of of scum, roughness of side walls of a pattern, the substrate dependency and the like. Therefore, functional polymers which can solve these problems have been demanded.

SUMMARY OF THE INVENTION

It is an object of the present invention to provide a polymer usable as a major component in a practically usable resist material which has high transmittance for ultraviolet light, particularly deep ultraviolet light and KrF excimer laser beams having a wavelength of 300 nm or less, high sensitivity to exposure to light using such a light source, electron beams, soft X-rays radiation, remarkably excellent heat resistance and adhesiveness to a substrate, high resolution, no change of pattern size with the lapse of time, capability to obtain a pattern with high precision, excellent storage stability, broard focus margins, good maks linearity, no substrate dependency, no footing nor scums and ability to obtain rectangular pattern shape with smooth sidewalls.

The present invention provides a polymer having repeating units of the formula:

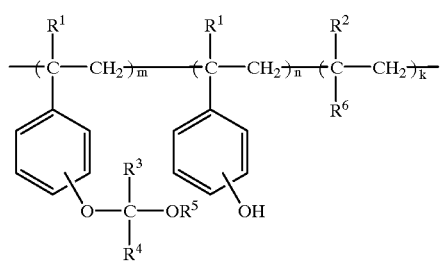

[1]

wherein $R^1$ and $R^2$ are independently a hydrogen atom or a lower alkyl group; $R^3$ and $R^4$ are independently a hydrogen atom or an alkyl group which may be sustituted with one or more halogen atoms, or $R^3$ and $R^4$ can form an alkylene ring together with the interposing carbon atom, provided that $R^3$ and $R^4$ cannot be hydrogen atoms at the same time; $R^5$ is an alkyl group which may be substituted with one or more halogen atoms, or an aralkyl group; $R^6$ is a phenyl group which may have one or more substituents, a carboxyl group which may be substituted with an alkyl group, or a cyano group; m and n are independently an integer of 1 or more; k is zero or an integer of 1 or more, provided that $0.1 \leq (m+k)/(m+n+k) \leq 0.9$ and $0 \leq k/(m+n+k) \leq 0.25$, said polymer having a degree of dispersion of 1 or more and less than 1.5.

The present invention also provides a resist material comprising the polymer mentioned above.

The resist material further comprises a photoacid generator which generates an acid by exposure to actinic radiation.

DESCRIPTION OF THE PREFERRED EMBODIMENTS

Figure 1:
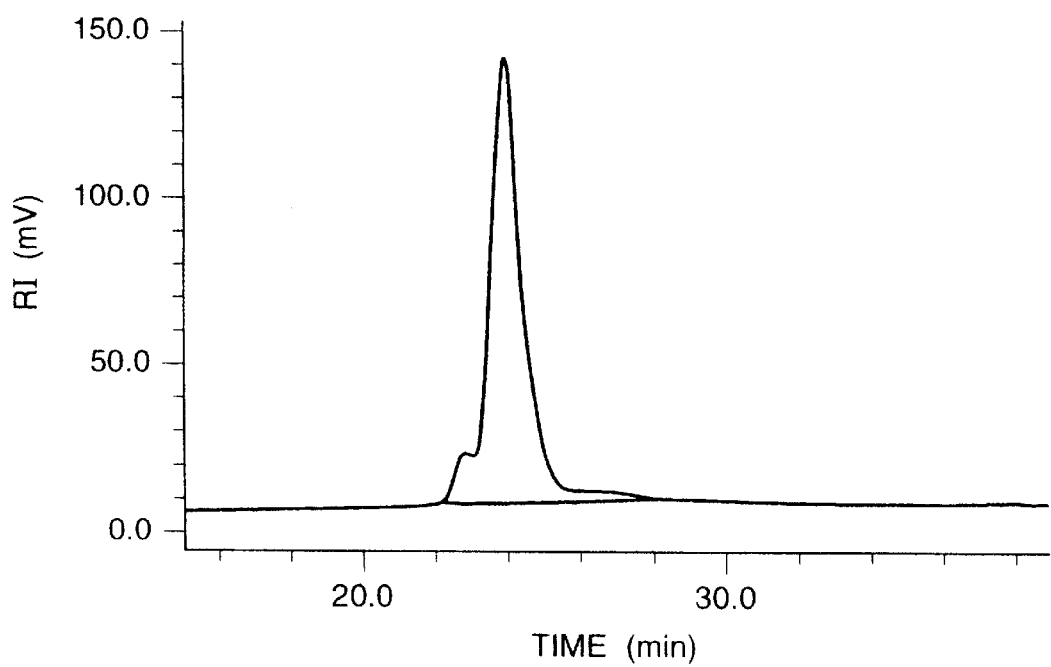
FIG. 1 is a chart of the polymer obtained in Production Example 1 measured by gel-permeation chromatography (GPC).

The polymer of the present invention has repeating units of the formula:

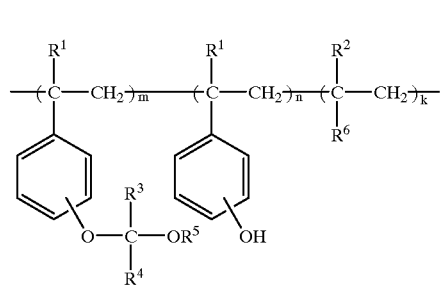

[1]

wherein $R^1$ and $R^2$ are independently a hydrogen atom or a lower alkyl group; $R^3$ and $R^4$ are independently a hydrogen atom or an alkyl group which may be sustituted with one or more halogen atoms, or $R^3$ and $R^4$ can form an alkylene ring together with the interposing carbon atom, provided that $R^3$ and $R^4$ cannot be hydrogen atoms at the same time; $R^5$ is an alkyl group which may be substituted with one or more halogen atoms, or an aralkyl group; $R^6$ is a phenyl group which may have one or more substituents, a carboxyl group which may be substituted with an alkyl group, or a cyano group; m and n are independently an integer of 1 or more; k is zero or an integer of 1 or more, provided that $0.1 \leq (m+k)/(m+n+k) \leq 0.9$ and $0 \leq k/(m+n+k) \leq 0.25$, said polymer having a degree of dispersion of 1 or more and less than 1.5.

In the formula [1], the lower alkyl group in the definitions of $R^1$ and $R^2$ is that having 1 to 4 carbon atoms, for example, a methyl group, an ethyl group, a n-propyl group, an isopropyl group, a n-butyl group, an isobutyl group, a tert-butyl group, and a sec-butyl group.

As the alkyl group which may be substituted with one or more halogen atoms in the definitions of $R^3$, $R^4$ and $R^5$, there can be used a straight, branched or cyclic alkyl group preferably having 1 to 10 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, a heptyl group, an octyl group, a nonyl group and a decyl group.

As the halogen which can substitute one or more hydrogens of the alkyl group in the definitions of $R^3$, $R^4$ and $R^5$, there can be used chlorine, bromine, fluorine and iodine.

The aralkyl group in the definition of $R^5$ includes, for example, a benzyl group, a phenetyl group, a phenylpropyl group, a methylbenzyl group, a methylphenetyl group, an ethylbenzyl group, etc.

The substituent for the phenyl group in the definition of $R^6$ includes a halogen atom such as chlorine, bromine, fluorine and iodine; a straight, branched or cyclic alkyl group preferably having 1 to 10 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, a heptyl group, an octyl group, a nonyl group, a decyl group, etc.; a straight or branched alkoxy group preferably having 1 to 6 carbon atoms, for example, a methoxy group, an ethoxy group, a n-propoxy group, an isopropoxy group, a n-butoxy group, an isobutoxy group, a tert-butoxy group, a sec-butoxy group, a n-pentyloxy group, an isopentyloxy group, a n-hexyloxy group, an isohexyloxy group, etc; a 5 or 6-membered saturated heterocyclicoxy group such as a tetrahydrofuranyloxy group, a tetrahydropyranyloxy group, etc.; or a group of the formula: $R^{22}O-CO-(CH_2)_jO-$, wherein $R^{22}$ is an alkyl group; and j is zero or an integer of 1. The alkyl group in the definition of $R^{22}$ is that having preferably 1 to 8 carbon atoms, for example, a methyl group, an ethyl group, a propyl group, a butyl group, a 1-methylcyclopentyl group, 1-methylcyclohexyl group, etc.

Concrete examples of the group of the formula: $R^{22}O-CO-(CH_2)_jO-$ include an ethoxycarbonyloxy group, an isopropoxycarbonyloxy group, an isobutoxycarbonyloxy group, a tert-butoxycarbonyloxy group, a tert-amyloxycarbonyloxy group, a methoxycarbonylmethoxy group, an ethoxycarbonylmethoxy group, a n-propoxycarbonylmethoxy group, an isopropoxycarbonylmethoxy group, a n-butoxycarbonylmethoxy group, an isobutoxycarbonylmethoxy group, a sec-butoxycarbonylmethoxy group, a tert-butoxycarbonylmethoxy group, a 1-methylcyclopentyloxycarbonylmethoxy group, a 1-methylcyclohexyloxycarbonylmethoxy group, etc.

The alkyl group as the substituent for the carboxyl group in the definition of $R^6$ can be straight, branched or cyclic alkyl groups preferably having 1 to 6 carbon atoms, for example, a methyl group, an ethyl group, a n-propyl group, an isopropyl group, a cyclopropyl group, a n-butyl group, an isobutyl group, a sec-butyl group, a tert-butyl group, a n-pentyl group, an isopentyl group, a tert-pentyl group, a 1-methylpentyl group, a cyclopentyl group, a n-hexyl group, an isohexyl group, a cyclohexyl group, etc.

The polymer of the present invention comprises a monomer unit of the formula:

[3]

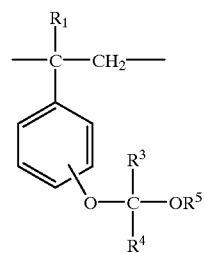

having a functional group of the formula:

[2]

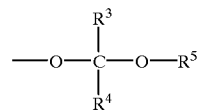

wherein $R^1$, $R^2$, $R^3$, $R^4$ and $R^5$ are as defined above, the functional group of the formula [2] being able to be easily eliminated by a small amount of acid, for example, an alkoxyalkyl group, a haloalkoxyalkoxy group or an aralkyloxyalkoxy group,
a monomer unit of the formula:

[4]

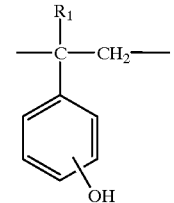

wherein $R^1$ is as defined above, so as to improve adhesiveness to substrate and heat resistance, and
a monomer unit of the formula:

[5]

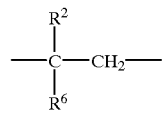

wherein $R^2$ and $R^6$ are as defined above, so as to improve light transmittance at exposed areas to light, and to improve mask linearity by controlling developing speed, said monomer unit of the formula [5] being used optionally depending on purposes, and said polymer having a degree of dispersion of molecular weight (Mw/Mn, Mw=weight-average molecular weight and Mn=number-average molecular weight) in the range of 1 or more and less than 1.5.

When the polymer having the repeating units of the formula [1] is used as a polymer component in a resist material, since the functional group of the formula [2] can remarkably easily be eliminated by the action of an acid to form a phenolic hydroxyl group compared with known functional groups such as a tert-butoxycarbonyloxy group, a tert-butoxy group, a trimethylsilyloxy group, a tetrahydropyranyloxy group, a tert-butoxycarbonylmethoxy group, etc., it is very advantageous to improve the resolution and to maintain pattern size without any change with the lapse of time (free from the problem in delay time) due to difficultly influenced by circumstances.

Even if a polymer has repeating units of the formula [1], when the polymer is obtained by a conventional radical polymerization and has a large degree of dispersion (e.g. more than 1.5, particularly 2 or more), there bring about various disadvantages when used as a polymer component in a resist material due to non-constant introducing ratio of the functional group of the formula [2]. The disadvantages are, for example, roughness of sidewalls of pattern due to difference in dissolution rate for a developer from a viewpoint of molecular level, remarkable appearance of scums, etc.

In contrast, when the polymer having repeating units of the formula [1] and a degree of dispersion of 1 or more and less than 1.5 (i.e., monodisperse polymer) is used, since the introducing ratio of the functional group of the formula [2] becomes constant, the dissoltion rate for a developer becomes constant from a viewpoint of molecular level, resulting in making the sidewalls of pattern smooth and improving scums at bottom portion of pattern.

The polymer of the present invention having repeating units of the formula [1] with a small degree of dispersion can usually be used alone as a polymer component in a resist material. But it is possible or preferable to mix two or more polymers of the present invention havng repeating units of the formula [1] with different functional groups and with a small degree of dispersion or to mix two or more monodisperse polymers hving different weight-average molecular weight so as to further improve the resolution, substrate adhesiveness, delay time, maintaining of pattern size, mask linearity, focus margin, and smoothness of sidewalls of pattern, etc. due to supplemental effects of individual polymers. Particularly when two or more polymers of the present invention having different weight-average molecular weights are mixed, more improvement in the resolution and substrate dependency can be expected.

Examples of the monomer having the monomer unit of the formula [3] are p- or m-hydroxystyrene derivatives, p- or m-hydroxy-α-methylstyrene derivatives, etc. Such monomers include, for example, p- or m-1-methoxy-1-methylethoxystyrene, p- or m-1-benzyloxy-1-methylethoxystyrene, p- or m-1-ethoxyethoxystyrene, p- or m-1-methoxyethoxystyrene, p- or m-1-n-butoxyethoxystyrene, p- or m-1-isobutoxyethoxystyrene, p- or m-1-(1,1-dimethylethoxy)-1-methylethoxystyrene, p- or m-1-(1,1-dimethylethoxy)ethoxystyrene, p- or mo-1-(2-chloroethoxy)ethoxystyrene, p- or m-1-(2-ethylhexyloxy)ethoxystyrene, p- or m-1-ethoxy-1-methylethoxystyrene, p- or m-1-n-propoxyethoxystyrene, p- or m-1-methyl-1-n-propoxyethoxystyrene, p- or m-1-ethoxypropoxystyrene, p- or m-1-methoxybutoxytstyrene, m- or p-1-methoxycyclohexyloxystyrene, etc. It is also possible to use p- or m-hydroxy-α-methylstyrene derivatives having the same protective groups as the p- or m-hydroxystyrene derivatives mentioned above.

Examples of the monomer having the monomer unit of the formula [4] are monomers having a phenolic hydroxyl group, for example, p- or m-vinylphenol, p- or m-hydroxy-α-methylstyrene, etc.

Examples of the monomer having the monomer unit of the formula [5] are styrene, α-methylstyrene, p-chlorostyrene, o-, m- or p-methylstyrene, o-, m- or p-methoxystyrene, p-n-butylstyrene, p-ethoxystyrene, m- or p-1-methylcyclohexyloxystyrene, m- or p-1-methylcyclopentyloxystyrene, m- or p-tert-butoxystyrene, m- or p-tetrahydropyranyloxystyrene, m- or p-tetrahydrofuranyloxystyrene, m- or p-methoxycarbonyloxystyrene, m- or p-ethoxycarbonyloxystyrene, m- or p-isopropoxycarbonyloxystyrene, m- or p-isobutoxycarbonyloxystyrene, m- or p-tetrabutoxycarbonyloxystyrene, m- or p-isoamyloxycarbonyloxy styrene, m- or p-tert-amyloxycarbonyloxystyrene, tert-butyl m- or p-vinylphenoxyacetate, 1-methylcyclopentyl, m- or p-vinylphenoxyacetate, 1-methylcyclohexyl m- or p-vinylphenoxyacetate, etc. It is also possible to use α-methylstyrene derivatives having the same substituents of the styrene derivatives as mentioned above, acrylic acid, methacrylic acid, methyl acrylate, methyl methacryalte, ethyl methacrylate, n-butyl methacrylate, tert-butyl methacrylate, cyclohexyl methacrylate, acrylonitrile, etc.

In the polymer of the present invention having repeating units of the formula [1], a total of the monomer unit of the formula [3] and the monomer unit of the formula [5] is preferably 10 to 90% by mole, more preferably 20 to 50% by mole, so as to improve heat resistance, adhesiveness to a substrate and mask linearity when used as a polymer component in a resist material.

The monomer unit of the formula [5] is contained in the repeating units of the formula [1] usually in the range of 0 to 25% by mole, preferably in the range of 0 to 15% by mole, so as to improve the mask linearity while controlling a lowering of resolution when used as a polymer component in a resist material.

Examples of the polymer of the present invention having repeating units of the formula [1] are as follows:

poly[p-(1-methoxy-1-methylethoxy)styrene/p-hydroxystyrene],
poly[p-(1-benzyloxy-1-methylethoxy)styrene/p-hydroxystyrene],
poly[p-(1-ethoxyethoxy)styrene/p-hydroxystyrene],
poly[p-(1-methoxyethoxy)styrene/p-hydroxystyrene],
poly[p-(1-n-butoxyethoxy)styrene/p-hydroxystyrene],
poly[p-(1,1-dimethylethoxy)-1-methylethoxystyrene/p-hydroxystyrene],
poly[p-(1-methoxy-1-methylethosy)styrene/p-hydroxystyrene/styrene],
poly[p-(1-methoxy-1-methylethoxy)styrene/p-hydroxystyrene/p-chlorostyrene],
poly[p-(1-methoxy-1-methylethoxy)styrene/p-hydroxystyrene/p-methylstyrene],
poly[p-(1-methoxy-1-methylethoxy)styrene/p-hydroxystyrene/p-methoxystyrene],
poly[p-(1-methoxy-1-methylethoxy)styrene/p-hydroxystyrene/p-tert-butoxystyrene],
poly[p-(1-methoxy-1-methylethoxy)styrene/p-hydroxystyrene/p-1-methylcyclohexyloxystyrene],
poly[p-(1-methoxy-1-methylethoxy)styrene/p-hydroxystyrene/p-tetrahydropyranyloxystyrene],
poly[p-(1-methoxy-1-methylethoxy)styrene/p-hydroxystyrene/p-isobutoxycarbonyloxystyrene],
poly[p-(1-methoxy-1-methylethoxy)styrene/p-hydroxystyrene/p-isopropoxycarbonyloxystyrene],
poly[p-(1-methoxy-1-methylethoxy)styrene/p-hydroxystyrene/methyl methacrylate],
poly[p-(1-methoxy-1-methylethoxy)styrene/p-hydroxystyrene/tert-butyl methacrylate],
poly[p-(1-methoxy-1-methylethoxy)styrene/p-hydroxystyrene/cyclohexyl methacrylate],
poly[p-(1-methoxy-1-methylethoxy)styrene/p-hydroxystyrene/acrylonitrile],
poly[p-(1-benzyloxy-1-methylethoxy)styrene/p-hydroxystyrene/styrene],
poly[p-(1-benzyloxy-methylethoxy)styrene/p-hydroxystyrene/p-chlorostyrene],
poly[p-(1-benzyloxy-1-methylethoxy)styrene/p-hydroxystyrene/p-methylstyrene],
poly[p-(1-benzyloxy-1-methylethoxy)styrene/p-hydroxystyrene/p-ethoxystyrene],
poly[p-(1-benzyloxy-1-methylethoxy)styrene/p-hydroxystyrene/p-tert-butoxystyrene],
poly(p-1-ethoxyethoxystyrene/p-hydroxystyrene/styrene),
poly(p-1-ethoxyethoxystyrene/p-hydroxystyrene/p-chlorostyrene),
poly(p-1-ethoxyethoxystyrene/p-hydroxystyrene/p-methylstyrene), poly(p-1-ethoxyethoxystyrene/p-hydroxystyrene/m-methylstyrene),
poly(p-1-ethoxyethoxystyrene/p-hydroxystyrene/p-methoxystyrene),
poly(p-1-ethoxyethoxystyrene/p-hydroxystyrene/p-ethoxystyrene),
poly(p-1-ethoxyethoxystyrene/p-hydroxystyrene/p-tert-butoxystyrene),
poly(p-1-ethoxyethoxystyrene/p-hydroxystyrene/p-methoxycarbonyloxystyrene),
poly(p-1-ethoxyethoxystyrene/p-hydroxystyrene/p-ethoxycarbonyloxystyrene),
poly(p-1-ethoxyethoxystyrene/p-hydroxystyrene/p-isopropoxycarbonyloxystyrene),
poly(p-1-methoxyethoxystyrene/p-hydroxystyrene/p-isobutoxycarbonyloxystyrene),
poly(p-1-ethoxyethoxystyrene/p-hydroxystyrene/p-isobutoxycarbonyloxystyrene),
poly(p-1-ethoxyethoxystyrene/p-hydroxystyrene/p-isoamyloxycarbonyloxystyrene),
poly(p-1-ethoxyethoxystyrene/p-hydroxystyrene/p-tert-amyloxycarbonyloxystyrene),
poly(p-1-ethoxyethoxystyrene/p-hydroxystyrene/p-1-methylcyclohexploxystyrene),
poly(p-1-ethoxyethoxystyrene/p-hydroxystyrene/methyl methacrylate),
poly(p-1-ethoxyethoxystyrene/p-hydroxystyrene/tert-butyl methacrylate),
poly(p-1-ethoxyethoxystyrene/p-hydroxystyrene/cyclohexyl methacrylate),
poly(p-1-ethoxyethoxystyrene/p-hydroxystyrene/acrylonitrile),
poly(p-1-methoxyethoxystyrene/p-hydroxystyrene/styrene),
poly(p-1-methoxyethoxystyrene/p-hydroxystyrene/p-methylstyrene),
poly(p-1-methoxyethoxystyrene/p-hydroxystyrene/m-methylstyrene),
poly(p-1-methoxyethoxystyrene/p-hydroxystyrene/p-chlorostyrene),
poly(p-1-methoxyethoxystyrene/p-hydroxystyrene/p-methoxystyrene),
poly(p-1-methoxyethoxystyrene/p-hydroxystyrene/p-ethoxystyrene),
poly(p-1-methoxyethoxystyrene/p-hydroxystyrene/p-tert-butoxystyrene),
poly(p-1-methoxyethoxystyrene/p-hydroxystyrene/p-1-methylcyclohexyloxystyrene),
poly(p-1-methoxyethoxystyrene/p-hydroxystyrene/methyl methacrylate),
poly(p-1-methoxyethoxystyrene/p-hydroxystyrene/tert-butyl methacrylate),
poly(p-1-methoxyethoxystyrene/p-hydroxystyrene/cyclohexyl methacrylate),
poly(p-1-methoxyethoxystyrene/p-hydroxystyrene/acrylonitrile),
poly(p-1-n-butoxyethoxystyrene/p-hydroxystyrene/p-n-butylstyrene),
poly(p-1-isobutoxyethoxystyrene/p-hydroxystyrene/o-methoxystyrene),
poly{p[(1,1-dimethylethoxy)-1-methylethoxy]styrene/p-hydroxystyrene/m-methoxystyrene},
poly[p-(1,1-dimethylethoxy)-1-methylethoxystyrene/p-hydroxystyrene/o-methylstyrene),
poly[m-1-(2-chloroethoxy)ethoxystyrene/m-hydroxystyrene/styrene],
poly[m-1-(2-ethylhexyloxy)ethoxystyrene/m-hydroxystyrene/m-methylstyrene],
poly[p-(1-methoxy-1-methylethoxy)-α-methylstyrene/p-hydroxy-α-methylstyrene/styrene],
poly[p-(1-ethoxy-1-methylethoxy)styrene/p-hydroxystyrene/p-methylstyrene],
poly(p-1-n-propoxyethoxystyrene/p-hydroxystyrene/p-methoxystyrene),
poly[p-(-1-methyl-1-n-propoxyethoxy)styrene/p-hydroxystyrene/p-methylstyrene],
poly(m-1-ethoxypropoxystyrene/m-hydroxystyrene/m-tert-butoxystyrene),
poly(m-1-ethoxypropoxystyrene/m-hydroxystyrene/p-methylstyrene),
poly[m-(1-methoxy-1-methylethoxy)styrene/m-hydroxystyrene/m-tert-butoxystyrene],
poly(p-1-ethoxyethoxystyrene/p-hydroxystyrene/p-tetrahydrofuranyloxystyrene),
poly(p-1-ethoxyethoxystyrene/p-hydroxystyrene/p-tetrahydropyranyloxystyrene),
poly(p-1-methoxyethoxystyrene/p-hydroxystyrene/p-tetrahydropyranyloxystyrene),
poly(p-1-ethoxyethoxystyrene/p-hydroxystyrene/p-tert-butoxycarbonyloxystyrene),
poly(p-1-methoxyethoxystyrene/p-hydroxystyrene/p-tert-butoxycarbonyloxystyrene),
poly[p-(1-methoxy-1-methylethoxy)styrene/p-hydroxystyrene/p-tert-butoxycarbonyloxystyrene],
poly(p-1-ethoxyethoxystyrene/p-hydroxystyrene/tert-butyl p-vinylphenoxyacetate),
poly(p-1-methoxyethoxystyrene/p-hydroxystyrene/tert-butyl p-vinylphenoxyacetate),
poly(p-1-methoxyethoxystyrene/p-hydroxystyrene/1-methylcyclohexyl p-vinylphenoxyacetate),
poly(m-1-ethoxyethoxystyrene/m-hydroxystyrene/m-tert-butoxycarbonyloxystyrene),
poly(m-1-ethoxyethoxystyrene/m-hydroxystyrene/m-tert-butoxystyrene),
poly(m-1-methoxyethoxystyrene/m-hydroxystyrene/m-tert-butoxystyrene), and
poly(p-1-methoxybutoxystyrene/p-hydroxystyrene/styrene).

Needless to say, the examples are not limited to those mentioned above.

The polymer of the present invention having repeating units of the formula [1] can easily be obtained, for example, by the following processes a) to d).

a) Process-1

A monomer of the formula:

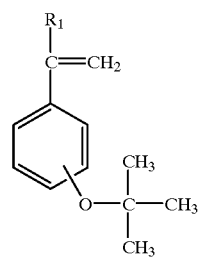

[6]

wherein $R^1$ is as defined above, and a monomer of the formula:

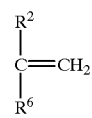
[7]

wherein $R^2$ and $R^6$ are as defined above, are polymerized in the presence of a living anion polymerization initiator in an anhydrous organic solvent in a stream of nitrogen or argon at −80° C. to 0° C. for 0.5 to 10 hours. As the living anion polymerization initiator, there can be used n-butyllithium, sec-butyllithium, tert-butyllithium, naphthalene potassium, cumyl potassium, etc. As the organic solvent, there can be used benzene, toluene, ethyl ether, 1,2-dimethoxyethane, tetrahydrofuran, cyclohexane, n-hexane, tetrahydropyrane, etc.

The polymerization is stopped by pouring methanol, water, or the like, followed by a conventional after-treatment to isolate a copolymer having repeating units of the formula:

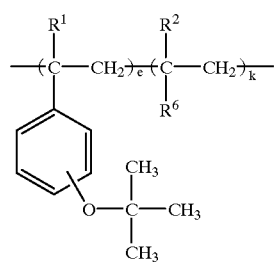
[8]

wherein $R^1$, $R^2$, $R^6$ and k are as defined above; and e is an integer of 1 or more, provided that $0.75 \leq e/(k+e) \leq 0.99$.

Then, the copolymer is reacted with an acid in an organic solvent at 30° to 110° C. for 1 to 20 hours to eliminate the functional group of tert-butyl group completely. As the organic solvent, there can be used tetrahydrofuran, acetone, methanol, ethanol, isopropanol, n-propanol, n-butanol, sec-butanol, tert-butanol, 1,4-dioxane, 1,3-dioxolane, etc. As the acid, there can be used an inorganic acid such as sulfuric acid, phosphoric acid, hydrochloric acid, hydrobromic acid, etc. and an organic acid such as a Lewis acid, p-toluenesulfonic acid, malonic acid, oxalic acid, etc.

After the reaction, the resulting hydroxystyrene copolymer having repeating units of the formula:

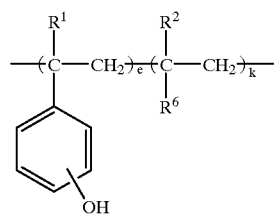
[9]

wherein $R^1$, $R^2$, $R^6$, e and k are as defined above, is isolated by a convention after-treatment.

The resulting copolymer is reacted with a vinyl ether or an isopropenyl ether of the formula:

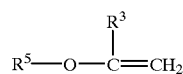
[10]

wherein $R^3$ and $R^5$ are as defined above, in an organic solvent in the presence of a catalyst at 10° to 100° C. for 1 to 30 hours to chemically introduce the functional group of the formula [2] into the copolymer. As the organic solvent, there can be used tetrahydrofuran, acetone, methyl ethyl ketone, methyl isobutyl ketone, 2-heptanone, 1,4-dioxane, 1,3-dioxolane, methylene chloride, 1,2-dimethoxyethane, ethyl ether, ethyl acetate, propylene glycol monomethyl ether acetate, etc. As the catalyst, there can be used sulfuric acid, hydrochloric acid, oxychlorophosphorus, p-toluenesulfonic acid, chlorosulfonic acid·pyridine salt, sulfuric acid·pyridine salt, p-toluenesulfonic acid·pyridine salt, etc.

The resulting copolymer is subjected to a conventional after-treatment to isolate the polymer having repeating units of the formula [1].

b) Process-2

After polymerizing a monomer of the formula [6] in the same manner as described in the Process-1, the resulting homopolymer having repeating units of the formula:

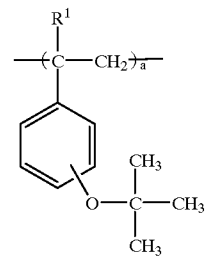
[11]

wherein $R^1$ is as defined above; and d is an integer of 1 or more, is isolated by a conventional after-treatment.

Then, the homopolymer is reacted with an acid in an organic solvent at 30°–100° C. for 1 to 10 hours to eliminate the functional group of tert-butyl group. As the organic solvent, there can be used tetrahydrofuran, acetone, 1,4-dioxane, 1,3-dioxolane, methanol, ethanol, n-propanol, isopropanol, n-butanol, sec-butanol, tert-butanol, etc. As the acid, there can be used an inorganic acid such as sulfuric acid, phosphoric acid, hydrochloric acid, hydrobromic acid, etc., or an organic acid such as a Lewis acid, p-toluenesulfonic acid, malonic acid, oxalic acid, etc.

After the reaction, the resulting hydroxystyrene copolymer having repeating units of the formula:

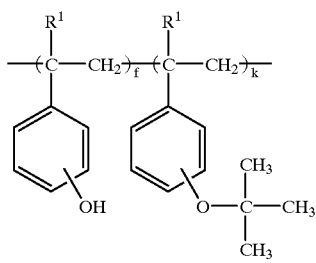

[12]

wherein $R^1$ and k are as defined above; and f=m+n, is isolated by a conventional after-treatment.

After introducing the functional group of the formula [2] into the copolymer in the same manner as the Process-1, the resulting copolymer is subjected to a conventioal after-treatment and the polymer having repeating units of the formula [1] is isolated.

c) Process-3

After polymerizing a monomer of the formula [6] or a monomer of the formula:

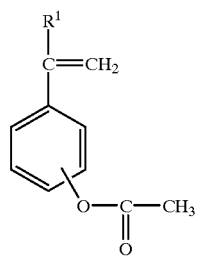

[13]

wherein $R^1$ is as defined above, in the same manner as described in the Process-1, the resulting homopolymer having repeating units of the formula [11] or repeating units of the formula:

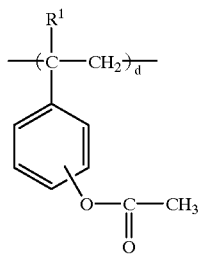

[14]

wherein $R^1$ is as defined above, is isolated by a conventional after-treatment.

Then, the resulting homopolymer is reacted in a solvent in a nitrogen stream in the presence of a suitable base or acid at 10° to 70° C. for 0.5 to 10 hours to eliminate the functional group of tert-butyl group or acetyl group, completely. As the solvent, there can be used tetrahydrofuran, 1,4-dioxane, 1,3-dioxolane, ethyl acetate, methanol, ethanol, n-propanol, isopropanol, n-butanol, sec-butanol, water, etc. As the base, there can be used alkali hydroxides such as sodium hydroxide, potassium hydroxide, etc.; alkali carbonates such as sodium carbonate, potassium carbonate, etc.; ammonia water; organic amines such as hydroxylamine, triethylamine, N-methyl-2-pyrrolidone, piperidine, etc.; tetraalkylammonium hydroxides such as tetramethylammonium hydroxide, choline, etc. As the acid, there can be used an inorganic acid such as sulfuric acid, hydrochloric acid, phosphoric acid, hydrobromic acid, etc. and an organic acid such as a Lewis acid, p-toluenesulfonic acid, malonic acid, oxalic acid, etc.

After the reaction, a hydroxystyrene polymer havng repeating units of the formula:

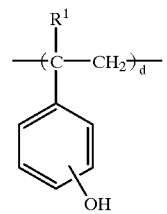

[15]

wherein $R^1$ and d are as defined above, is isolated by a conventional method.

After introducing the functional group of the formula [2] into the homopolymer in the same manner as described in the Process-1, the polymer having repeating units of the formula [1] is isolated by a conventional after-treatment.

d) Process-4

The homopolymer havng repeating units of the formula [15] obtained in the Process-3 is reacted with an agent for protecting the hydroxyl grop in an organic solvent in the presence of a base at 10° to 100° C. for 0.5 to 30 hours. As the organic solvent, there can be used tetrahydrofuran, 1,4-dioxane, ethyl acetate, methyl ethyl ketone, acetone, methylene chloride, 1,3-dioxolane, methanol, ethanol, n-propanol, isopropanol, n-butanol, sec-butanol, tert-butanol, etc. As the base there can be used alkali hydroxides such as sodium hydroxide, potassium hydroxide, etc.; alkali carbonates such as sodium carbonate, potassium carbonate, etc.; ammonia water; organic amines such as hydroxylamine, triethylamine, N-methyl-2-pyrrolidone, piperidine, etc.; tetraalkylammonium hydroxides such as tetramethylammonium hydroxide, choline, etc. As the agent for protecting the hydroxyl group, there can be used dialkyl dicarbonates such as di-tert-butyl dicarbonate; alkyl chlorocarbonates such as methyl chlorocarbonate; 2,3-dihydrofuran, 2,3-dihydropyran, tert-butyl monochloroacetate, 1-methylcyclohexyl monochloroacetate, isobutene, dimethyl sulfate, methyl iodide, chlorinated 1-methylocyclohexyl, etc. After the reaction, there can be obtained a polymer having repeating units of the formula [9] by a conventional after-treatment.

The resulting polymer is subjected to the introduction of the functional group of the formula [2] in the same manner as described in the Process-1, followed by a conventional after-treatment to isolate the polymer having repeating units of the formula [1].

Apart from the polymerization using a living anion polymerization initiator in the Process-1, the polymer having repeating units of the formula [1] can also be obtained by radical polymerization using a conventional peroxide polymerization initiator or an azo polymerization initiator, followed by repeat of reprecipitation of the polymer so as to narrow the molecular weight distribution, and the same treatment as in the Process-1.

When the polymer having repeating units of the formula [1] is used in a resist material, a preferable polymer has repeating units of the formula:

[1]

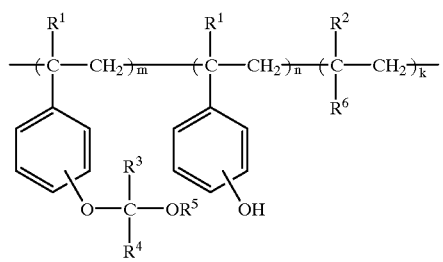

wherein $R^1$ and $R^2$ are independently a hydrogen atom or a lower alkyl group; either one of $R^3$ and $R^4$ is a hydrogen atom or an lower alkyl group and the rest of $R^3$ and $R^4$ is a lower alkyl group; $R^5$ is a lower alkyl group; $R^6$ is a phenyl group substituted with a lower alkyl group, a lower alkoxy group, or a group of the formula: $R^{22}O-CO-(CH_2)_j-O-$ (in which $R^{22}$ is a lower alkyl group; j is zero or an integer of 1); m and n are independently an integer of 1 or more; k is zero or an integer of 1 or more, provided that $0.1 \leq (m+k)/(m+n+k) \leq 0.9$ and $0 \leq k/(m+n+k) \leq 0.25$.

The weight-average molecular weight of the polymer having repeating units of the formula [1] is not particularly limited so long as the polymer can be used as a resist material. Preferable range is a weight-average molecular weight (Mw) of about 1000 to about 30,000, more preferably about 2000 to about 25000, when measured by gel-permeation chromatography (GPC) using polystyrene as standard. The ratio (Mw/Mn, Mn=number-average molecular weight), that is, the degree of dispersion, should be 1 or more and less than 1.5. In order to make the dissolution rate into the developer at the exposed area at the time of development more uniform, and as a result to make sidewalls of pattern more smooth, the degree of dispersion of 1 to 1.3 is preferable, and the degree of dispersion of 1 to 1.2 is more preferable.

When two or more polymers having repeating units of the formula [1] with a small degree of dispersion are mixed as a polymer component in a resist material, the proportion of the polymer having the largest weight-average molecular weight is preferably 30 to 99% by weight, more preferably 30 to 80% by weight, in order to obtain better heat resistance, mask linearity and proximity effect.

The resist material of the present invention comprises the polymer having repeating units of the formula [1] with the degree of dispersion of 1 or more and less than 1.5, and a photoacid generator which generates an acid when exposed to actinic radiation. The resist material is generally used in a state of a varnish dissolving the polymer in a solvent.

As the photoacid generator, there can be used any substances which can generate an acid upon exposure to actinic radiation and do not give bad influence for resist pattern formation. Preferable photoacid generators are those which can maintain high transparency of the resist material due to good light transmittance particularly near 248.4 nm, or those which can enhance light transmittance near 248.4 nm by exposure to light and can maintain high transparency of the resist material. Preferable photoacid generators are compounds of the formulae [16], [17], [18], [20], [21] and [22] mentioned below:

[16]

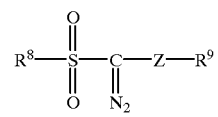

wherein $R^8$ and $R^9$ are independently an alkyl group, a haloalkyl group, or an aralkyl group; Z is $-CO-$ or $-SO_2-$;

[17]

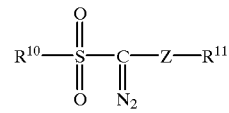

wherein $R^{10}$ is a phenyl group which may have one or more substituents; $R^{11}$ is an alkyl group, a haloalkyl group, an aralkyl group, or a phenyl group which may have one or more substituents; and Z is $-CO-$ or $-SO_2-$;

[18]

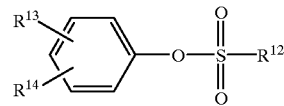

wherein $R^{12}$ is an alkyl group, a haloalkyl group or a phenyl group which may have one or more substituents; $R^{13}$ and $R^{14}$ are independently a hydrogen atom, a halogen atom, an alkyl group, a haloalkyl group or a group of the formula:

[19]

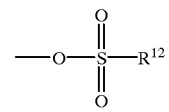

wherein $R^{12}$ is as defined above;

[20]

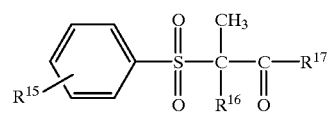

wherein $R^{15}$ is a hydrogen atom, a halogen atom, an alkyl group or a haloalkyl group; $R^{16}$ is an alkyl group; $R^{17}$ is an alkyl group, a phenyl group which may have one or more substituents, or an aralkyl group;

[21]

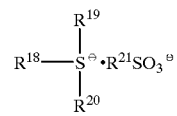

wherein $R^{18}$, $R^{19}$ and $R^{20}$ are independently an alkyl group, a phenyl group, an alkyl-substituted phenyl group, a haloalkyl group or an aralkyl group; and $R^{21}$ is a fluoroalkyl group, a phenyl group, a haloalkylphenyl group or a tolyl group; and

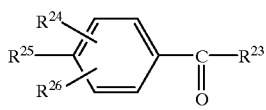

wherein $R^{24}$, $R^{25}$ and $R^{26}$ are independently a hydrogen atom, an alkylsulfonyloxy group, a haloalkylsulfonyloxy group, or a group of the formula:

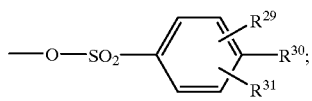

$R^{23}$ is an alkyl group or a group of the formula:

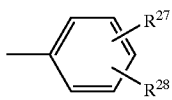

in which $R^{27}$ and $R^{28}$ are independently a hydrogen atom, a hydroxyl group, an alkylsulfonyloxy group, a haloalkylsulfonyloxy group, or a group of the formula [24], in which $R^{29}$, $R^{30}$ and $R^{31}$ are independently a hydrogen atom, a halogen atom, an alkyl group or a haloalkyl group.

In the formula [16], the alkyl moiety in the alkyl group and the haloalkyl group in the definition of $R^8$ and $R^9$ is a straight, branched or cyclic alkyl group preferably having 1 to 10 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, a heptyl group, an octyl group, a nonyl group, a decyl group, etc. As the halogen in the haloalkyl group, there can be used chlorine, bromine, fluorine and iodine. Examples of the aralkyl group are a benzyl group, a phenethyl group, a phenylpropyl group, a methylbenzyl group, a methylphenethyl group, an ethylbenzyl group, etc.

In the formula [17], the substituent for the phenyl group in the definition of $R^{10}$ and $R^{11}$ includes a halogen atom such as chlorine, bromine, fluorine and iodine; an alkyl group or a haloalkyl group is either straight, branched or cyclic, and the alkyl moiety preferably has 1 to 10 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, a heptyl group, an octyl group, a nonyl group, a decyl group, etc.; and an alkoxy group, either straight, branched or cyclic, preferably having 1 to 6 carbon atoms, for example, a methoxy group, an ethoxy group, a n-propoxy group, an isopropoxy group, a n-butoxy group, an isobutoxy group, a tert-butoxy group, a sec-butoxy group, a n-pentyloxy group, an isopentyloxy group, a n-hexyloxy group, an isohexyloxy group, etc. The alkyl moiety in the alkyl group and the haloalkyl group in the definition of $R^{11}$ includes straight, branched and cyclic alkyl groups preferably having 1 to 10 carbon atoms, for example, those mentioned above in the substituents for the phenyl group. The halogen in the haloalkyl group includes chlorine, bromine, fluorine and iodine. The aralkyl group in the definition of $R^{11}$ includes, for example, a benzyl group, a phenethyl group, a phenylpropyl group, a methylbenzyl group, a methylphenethyl group, an ethylbenzyl group, etc.

In the formula [18], the alkyl moiety in the alkyl group and the haloalkyl group in the definition of $R^{12}$, $R^{13}$ and $R^{14}$ includes straight, or branched alkyl groups preferably having 1 to 6 carbon atoms, for example, a methyl group, an ethyl group, a n-propyl group, an isopropyl group, a n-butyl group, an isobutyl group, a tert-butyl group, a sec-butyl group, a n-pentyl group, an isopentyl group, a tert-pentyl group, a 1-methylpentyl group, a n-hexyl group, an isohexyl group, etc. The halogen in the haloalkyl group includes chlorine, bromine, fluorine, and iodine. The substituent for the phenyl group in the definition of $R^{12}$ includes a halogen atom such as chlorine, bromine, fluorine and iodine; an alkyl group or a haloalkyl group, either straight, branched or cyclic, and the alkyl moiety preferably has 1 to 10 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, a heptyl group, an octyl group, a nonyl group, a decyl group, etc. The halogen in the haloalkyl group includes chlorine, bromine, fluorine and iodine. Concrete examples of the haloalkyl group are a trifluoromethyl group, a trifluoroethyl group, a trifluoropropyl group, etc. The halogen atom in the definition of $R^{13}$ and $R^{14}$ includes chlorine, bromine, fluorine and iodine.

In the formula [20], the halogen atom in the definition of $R^{15}$ includes chlorine, bromine, fluorine and iodine; the alkyl moiety in the alkyl group or the haloalkyl group in the definition of $R^{15}$ is either straight, or branched and preferably having 1 to 6 carbon atoms, for example, a methyl group, an ethyl group, a n-propyl group, an isopropyl group, a n-butyl group, an isobutyl group, a tert-butyl group, a sec-butyl group, a n-pentyl group, an isopentyl group, a tert-pentyl group, a 1-methyl pentyl group, a n-hexyl group, an isohexyl group, etc; and the halogen atom in the haloalkyl group includes chlorine, bromine, fluorine and iodine. The alkyl group in the definition of $R^{16}$ includes either straight or branched alkyl groups preferably having 1 to 3 carbon atoms, for example, a methyl group, an ethyl group, a n-propyl group, an isopropyl group, etc. The alkyl group in the definition of $R^{17}$ includes either straight, branched or cyclic alkyl groups preferably having 1 to 6 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, etc. The substituent for the phenyl group in the definition of $R^{17}$ includes a halogen atom such as chlorine, bromine, fluorine, and iodine; an alkyl group and haloalkyl group, wherein the alkyl moiety in these groups includes straight, branched and cyclic alkyl groups preferably having 1 to 10 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, a heptyl group, an octyl group, a nonyl group, a decyl group, etc. The halogen atom in the haloalkyl group includes chlorine, bromine, fluorine and iodine. Concrete examples of the haloalkyl group are a trifluoromethyl group, a trifluoroethyl group, a trifluoropropyl group, etc. The aralkyl group in the definition of $R^{17}$ includes, for example, a benzyl group, a phenethyl group, a phenylpropyl group, a methylbenzyl group, a methylphenethyl group, an ethylbenzyl group, etc.

In the formula [21], the alkyl moiety in the alkyl group and the haloalkyl group in the definition of $R^{18}$, $R^{19}$ and $R^{20}$ includes straight, branched and cyclic alkyl groups preferably having 1 to 8 carbon atoms, for example, a methyl group, an ethyl group, a n-propyl group, an isopropyl group, a cyclopropyl group, a n-butyl group, an isobutyl group, a tert-butyl group, a sec-butyl group, a n-pentyl group, an isopentyl group, a tert-pentyl group, a 1-methylpentyl group, a cyclopentyl group, a n-hexyl group, an isohexyl group, a cyclohexyl group, a heptyl group, an octyl group, etc. The halogen atom in the haloalkyl group includes chlorine, bromine, fluorine and iodine. Concrete preferable examples of the haloalkyl group are a trifluoromethyl group, a trifluoroethyl group, a trifluoropropyl group, etc. The alkyl group in the alkyl-substituted phenyl group in the definition of $R^{18}$, $R^{19}$ and $R^{20}$ includes straight, branched and cyclic alkyl groups preferably having 1 to 10 carbon atoms, for example, those mentioned above (havng 1 to 8 carbon atoms), and a nonyl group, a decyl group, etc. The aralkyl group in the definition of $R^{18}$, $R^{19}$ and $R^{20}$ includes a benzyl group, a phenethyl group, a phenylpropyl group, a methylbenzyl group, a methylphenethyl group, an ethylbenzyl group, etc. The alkyl moiety in the perfluoroalkyl group in the definition of $R^{21}$ includes straight, branched and cyclic alkyl groups preferably having 1 to 8 carbon atoms, for example, those mentioned above. The number of fluorine atom substituted is preferably 1 to 17. The alkyl moiety in the haloalkylphenyl group in the definition of $R^{21}$ includes straight, branched and cyclic alkyl groups preferably having 1 to 8 carbon atoms, for example, those mentioned above. The halogen in the haloalkylphenyl group includes chlorine, bromine, fluorine and iodine.

In the formula [22], the alkyl group in the definition of $R^{23}$ includes straight and branched alkyl groups preferably having 1 to 3 carbon atoms, for example, a methyl group, an ethyl group, a n-propyl group, an isopropyl group, etc. The alkyl moiety in the alkylsulfonyloxy group and the haloalkylsulfonyl group in the definition of $R^{24}$, $R^{25}$, $R^{26}$, $R^{27}$ and $R^{28}$ includes straight and branched alkyl groups preferably having 1 to 3 carbon atoms, for example, those as mentioned above. The halogen in the haloalkyl group includes chlorine, bromine, fluorine and iodine. Concrete preferable examples of the haloalkyl group are a trifluoromethyl group, a trifluoroethyl group, a trifluoropropyl group, etc. The alkyl moiety in the alkyl group and the haloalkyl group in the definition of $R^{29}$, $R^{30}$ and $R^{31}$ includes straight and branched alkyl groups preferably having 1 to 6 carbon atoms, for example, a methyl group, an ethyl group, a n-propyl group, an isopropyl group, a n-butyl group, an isobutyl group, a tert-butyl group, a sec-butyl group, a n-pentyl group, an isopentyl group, a tert-pentyl group, a n-hexyl group, an isohexyl group, etc. The halogen in the halogen atom and the haloalkyl group includes chlorine, bromine, fluorine and iodine. Preferable examples of the haloalkyl group are a trifluoromethyl group, a trifluoroethyl group, a trifluoropropyl group, etc.

Preferable photoacid generators of the formula [16] are as follows:
1-cyclohexylsulfonyl-1-(1,1-dimethylsulfonyl) diazomethane,
bis(1,1-dimethylethylsulfonyl) diazomethane,
bis(1-methylethylsulfonyl) diazomethane,
bis(cyclohexylsulfonyl) diazomethane,
dibenzylsulfonyl diazomethane,
bis(p-toluenesulfonyl) diazomethane,
1-cyclohexylsulfonyl-1-cyclohexylcarbonyl diazomethane,
1-diazo-1-cyclohexylsulfonyl-3,3-dimethylbutan-2-one,
1-diazo-1-methylsulfonyl-4-phenylbutan-2-one,
1-diazo-1-(1,1-dimethylethylsulfonyl)-3,3-dimethyl-2-butanone,
1-acetyl-1-(1-methylethylsulfonyl) diazomethane, etc.

Preferable photoacid generators of the formula [17] are as follows:
methylsulfonyl-p-toluenesulfonyl diazomethane,
bis(p-chlorobenzenesulfonyl) diazomethane,
bis(p-toluenesulfonyl) diazomethane,
bis(p-trifluoromethylbenzenesulfonyl) diazomethane,
dibenzenesulfonyl diazomethane,
bis(2,4-dimethylbenzenesulfonyl) diazomethane,
bis(p-tert-butylbenzenesulfonyl) diazomethane,
cyclohexylsulfonyl-p-toluenesulfonyl diazomethane,
1-diazo-1-(p-toluenesulfonyl)-3,3-dimethylbutan-2-one,
1-p-toluenesulfonyl-1-cyclohexylcarbonyl diazomethane,
1-diazo-1-benzenesulfonyl-3,3-dimethylbutan-2-one,
1-diazo-1-(p-toluenesulfonyl)-3-methylbutan-2-one, etc.

Preferable photoacid generators of the formula [18] are as follows:
1,2,3-tris(trifluoromethanesulfonyloxy)benzene,
1,2,3-tris(methanesulfonyloxy)benzene,
1,2,3-tris(p-toluenesulfonyloxy)benzene,
1,2,3-tris(trifluoromethylbenzenesulfonyloxy)benzene,
p-trifluoromethanesulfonyloxytoluene,
1,2,4-tris(trifluoromethanesulfonyloxy)benzene
1,2,3-tris(benzenesulfonyloxy)benzene,
1,2,4-tris(p-toluenesulfonyloxy)benzene,
1,2,3-tris(p-chlorobenzenesulfonyloxy)benzene,
1,2,3-tris(perfluoroethanesulfonyloxy)benzene,
p-(p-trifluoromethylbenzenesulfonyloxy)toluene, etc.

Preferable photoacid generators of the formula [20] are as follows:
2-(p-toluenesulfonyl)-2-benzoylpropane,
2-benzenesulfonyl-2-benzoylpropane,
2-(p-toluenesulfonyl)-2,4-dimethylpentan-3-one,
2-(p-toluenesulfonyl)-2,4,4-trimethylpentan-3-one,
2-(p-toluenesulfonyl)-2-(p-methylphenylcarbonyl)propane,
4-(p-toluenesulfonyl)-2,4-dimethylhexan-3-one, etc.

Preferable photoacid generators of the formula [21] are as follows:
triphenylsulfonium trifluoromethanesulfonate,
triphenylsulfonium perfluorooctanesulfonate,
diphenyl-p-tolylsulfonium perfluorooctanesulfonate,
tris(p-tolyl)sulfonium perfluorooctanesulfonate,
tris(p-chlorobenzene)sulfonium trifluoromethanesulfonate,
tris(p-tolyl)sulfonium trifluoromethanesulfonate,
trimethylsulfonium trifluoromethanesulfonate,
dimethylphenylsulfonium trifluoromethanesulfonate,
dimethyltolylsulfonium trifluorometthanesulfonate,
dimethyltolylsulfonium perfluorooctanesulfonate, etc.

Preferable photoacid generators of the formula [22] are as follows:
2,3,4-tris(p-fluorobenzenesulfonyloxy) acetophenone,
2,3,4-tris(p-trifluoromethylbenzensulfonyloxy) acetophenone,
2,3,4-tris(2,5-dichlorobenzenesulfonyloxy) acetophenone,
2,3,4-(p-toluenesulfonyloxy) acetophenone, 2,3,4-tris(trifluoromethanesulfonyl) acetophenone,
2,3,4-(p-trifluoromethylbenzenesulfonyloxy) propiophenone,
2,3,4-(2,5-dichlorobenzenesulfonyloxy) propiophenone,
2,4,6-tris(p-trifluoromethylbenzenesulfonyloxy) acetophenone,
2,4,6-tris(2,5-dichlorobenzenesulfonyloxy) acetophenone,
2,4,5-tris(2,5-dichlorobenzenesulfonyloxy) acetophenone,
2,2',4,4'-tetra(p-trifluoromethylbenzenesulfonyloxy) benzophenone,
2,2',4,4'-tetra(2,5-dichlorobenzenesulfonyloxy) benzophenone,
2,2',4,4'-tetra(p-fluorobenzenesulfonyloxy) benzophenone,
2,2',4,4'-tetra(tgrifluoromethanesulfonyloxy) benzophenone,
2,4,4'-tris(p-toluenesulfonyloxy) benzophenone,
2,4,4'-tris(trifluoromethanesulfonyloxy) benzophenone, etc.

The resist material of the present invention comprises the polymer having repeating units of the formula [1] and one or more photoacid generators of the formulae [16], [17], [18], [20], [21] and [22]. The photoacid generator of the formula [16] is effective for maintaining high transparency of the resist material due to good light transmittance near 248.4 nm, for giving less PEB temperature dependency and for generating a week acid such as carbonic acid upon exposure to actinic radiation. On the other hand, the photoacid generators of the formulae [17], [18], [20], [21] and [22] are effective for giving high acid generation efficiency upon exposure to a constant amount of actinic radiation or generating a strong acid such as sulfonic acid. Therefore, a combination of one or more photoacid generators of the formula [16] and one or more photoacid generators of the formulae [17], [18], [20], [21] and [22] is preferable in order to remove scums.

In order to improve the residue of scums and the shape of bottom portions of pattern without causing a problem of delay time and to maintain stable pattern shape and dimension, it is preferable to use one or more photoacid generators of the formulae [17], [18], [20], [21] and [22] in an amount of preferably 1 to 70 parts by weight, more preferably 10 to 50 parts by weight per 100 parts by weight of the photoacid generator of the formula [16].

The photoacid generator of the formula [21] is particularly effective to remove scums when used alone, but also brings about a problem of poor pattern shape and dimensional change due to an influence of delay time. In such a case, such a problem can be solved by using a overcoat film together.

As photoacid generators other than those mentioned above, there have been used vaious triphenylphosphonium salts, diphenyliodonium salts (as anions for these onium salts, there are $PF_6^-$, $AsF_6^-$, $BF_4^-$, etc.) and tris(trichloromethyl-s-triazine/triethanolamine. But when these photoacid generators are used alone in chemically amplified type resist mateials, a strong acid (e.g. a Lewis acid) is generated upon exposure to light and evaporated from a surface layer of resist film after exposure to light due to volatility of the strong acid, and is remarkably influenced by an atmosphere of amine or the like, or is easily transferred. Thus, even if an overcoat film is used together the transfer of acid in the resist film cannot be controlled. As a result, with the lapse of time from the exposure to light to the development, the so-called T-shape or overhang profiles are generated during the pattern formation, or the pattern formation dimension is greatly changed, or sometimes pattern is not formed at all. Further, there is also a problem in storage stability, e.g. changes in sensitivity during storage, and impossibility of forming a pattern. Therefore, the above-mentioned known photoacid generators cannot be used in the present invention.

As the solvent for the resist material of the present invention, there can be used any solvents which can dissolve the polymer having repeating units of the formula [1], the photoacid generator, and one or more additives such as phenolic compounds, ultraviolet absorbents, surfactants, etc., added depending on purposes. Generally, solvents having good film forming properties and having no absorption near 220 to 400 nm are preferably used. Examples of such solvents are methyl Cellosolve acetate, ethyl Cellosolve acetate, propylene glycol monomethyl ether acetate, propylene glycol monoethyl ether acetate, methyl lactate, ethyl lactate, 2-ethoxyethyl acetate, methyl pyrurate, ethyl pyrurate, methyl 3-methoxypropionate, ethyl 3-methoxypropionate, N-methyl-2-pyrrolidone, cyclohexanone, methyl ethyl ketone, 2-heptanone, 1,4-dioxane, diethylene glycol monomethyl ether, diethylene glycol dimethyl ether, ethylene glycol monoisopropyl ether, N,N-dimethylformamide, N,N-dimethylformamide dibutylacetate, N,N-dimethylacetamide, N,N-dimethylacetamide methylacetal, N,N-dimethylpropionamide, etc.

The mixing ratio of the polymer and the photoacid generator in the resist material of the present invention is preferably 1 to 30 parts by weight, more preferably 1 to 20 parts by weight of the photoacid generator per 100 parts by weight of the polymer. The amount of the solvent in the resist material of the present invention is preferably 1 to 20 parts by weight, more preferably 1.5 to 10 parts by weight per part by weight of the polymer.

The resist material of the present invention comprises the above-mentioned three components (i.e. the polymer of the present invention, one or more photoacid generators, and a solvent) and, if necessary may further contain one or more conventional additives such as phenolic compounds, ultraviolet absorbents, sensitivity adjusting agents, plasticizers, photosensitizers, organic acids, surfactants, etc.

As the phenolic compounds, there can be used those which can control the developing rate at exposed areas and make the sidewall shape desirable, and have the weight-average molecular weight of about 300 to about 10,000. Examples of the phenolic compound are phenol resins such as p-cresol/formaldehyde resin (polycondensate), m-cresol/formaldehyde resin, p-cresol/m-cresol/formaldehyde resin, p-cresol/acetaldehyde resin, m-cresol/acetaldehyde resin, p-cresol/m-creasol/acetaldehyde resin, phenol/formaldehyde resin, etc.; polycondensates of a phenol and a dimethylol compound such as phenol/1,4-dihydroxymethylbenzene polycondensate, p-cresol/1,4-dihydroxymethylbenzene polycondensate, m-cresol/1,4-dihydroxymethylbenzene polycondensate, p-cresol/m-cresol/1,4-dihydroxymethylbenzene polycondensate, etc.; 2-methyl-2,3,3-tri(p-hydroxyphenyl)propane, 2,2',6,6'-tetrakis(2-hydroxy-5-methylbenzyl) bisphenol, 2,2',6,6'-tetrakis(2-hydroxy-3,5-dimethylbenzyl) bisphenol, etc. These phenolic compounds can be used singly or as a mixture thereof in the resist material of the present invention in an amount of preferably 1 to 25 parts by weight, more preferably 5 to 15 parts by weight per 100 parts by weight of the polymer.

As the ultraviolet absorbent, there can be used 9-diazofluorene and derivatives thereof, 1-diazo-2-tetralone, 2-diazo-1-tetrarone, 9-diazo-10-phenanthrone, 9-(2-methoxyethoxy)methylanthracene, 9-(2-ethoxyethoxy)methylanthracene, 9-(4-methoxybutoxy)methylanthracene, 9-anthracenemethyl acetate, floresceine, fluorescin, etc., singly or as a mixture thereof.

The ultraviolet absorbent can be used in the resist material of the present invention in an amount of preferably 0.1 to 10 parts by weight, more preferably 0.5 to 5 parts by weight, per 100 parts by weight of the polymer.

As the sensitivity adjusting agent, there can be used polyvinylpyridine, poly(vinylpyridine/methyl methacrylate), pyridine, piperidine, tri-n-butylamine, trioctylamine, tribenzylamine, dicyclohexylamine, dicyclohexylmethylamine, tetramethylammonium hydroxide, tetraethylammonium hydroxide, tetra-n-propylammonium hydroxide, tetra-n-butylammonium hydroxide, choline, triethanolamine, tripyridine, bipyridine, 3-aminopyridine, triethylamine, N-methyl-2-pyrrolieone, etc., singly or as a mixture thereof.

The sensitivity adjusting agent can be used in the resist material of the present invention in an amount of preferably 0.1 to 10 parts by weight, more preferably 0.5 to 5 parts by weight by weight, per 100 parts by weight of the polymer.

As the plasticizer, there can be used diethyl phthalate, dibutyl phthalate, dipropyl phthalate, etc., singly or as a mixture thereof.

The plasticizer can be used in the resist material of the present invention in an amount of preferably 0.1 to 10 parts by weight, more preferably 0.5 to 5 parts by weight, per 100 parts by weight of the polymer.

As the photosensitizer, there can be used 2-mercaptobenzothiazole, 2-mercaptobenzoxazole, benzophenone, 2,2'4,4'-tetrahydroxybenzophenone, 2,2',4-trihydroxybenzophenone, 4,4'-dihydroxybenzophenone, 2,3,4-trihydroxybenzophenone, pyrene derivatives, pyrene derivatives, benzotriazole, etc., singly or as a mixture thereof.

The photosensitizer can be used in the resist material of the present invention in an amount of preferably 0.1 to 10 parts by weight, more preferably 0.5 to 5 parts by weight, per 100 parts by weight of the polymer.

As the organic acid, there can be used benzoic acid, o-acetylbenzoic acid, salicylic acid, p-hydroxybenzoic acid, o-cyanobenzoic acid, phthalic acid, salicylhydroxamic acid, etc., singly or as a mixture thereof.

The organic acid can be used in the resist material of the present invention in an amount of preferably 0.1 to 10 parts by weight, more preferably 0.5 to 5 parts by weight, per 100 parts by weight of the polymer.

As the surfactant, there can be used nonionic surfactants such as polyethylene glycol distearate, polyoxyethylene stearyl ether, polyoxyethylene lauryl ether, polyoxyethylene cetyl ether, etc.; fluorine-containing nonionic surfactants such as Fluorad (a trade name, available from Sumitomo 3M, Ltd.), SURFLON (a trade name, available from Asahi Glass Co., Ltd.), UNIDYNE (a trade name, available from Daikin Industries, Ltd.), MEGAFAC (a trade name, available from Dainippon Ink & Chemicals, Incorp.), EFTOP (a trade name, available from Tohken Products Corp.), etc.; fluorine-containing cationic surfactants, fluorine-containing anionic surfactants, and if necessary, one or more polyethylene glycol, polypropylene glycol, etc., singly or as a mixture thereof.

The surfactant can be used in the resist material of the present invention in an amount of preferably 0.1 to 10 parts by weight, more preferably 0.5 to 5 parts by weight, per 100 parts by weight of the polymer.

Pattern formation using the resist material of the present invention can be carried out as follows.

The resist material of the present invention is coated on a semiconductor substrate such as a silicon wafer so as to make the film thickness about 0.5 to 2.0 $\mu$m (when used as an upper layer in three layers, about 0.1–0.5 $\mu$m in thickness), and prebaked in an oven at 70° to 130° C. for 10 to 30 minutes, or on a hot plate at 70° to 130° C. for 1 to 2 minutes to form a resist film. Then, a mask for forming the desired pattern is placed on the resist film and exposed to deep ultraviolet light of, e.g. 300 nm or less at exposure dose of about 1 to 100 mJ/cm$^2$, followed by baking on a hot plate at 70° to 150° C. for 1 to 2 minutes. Then, the development is carried out using, e.g. 0.1 to 5% tetramethylammonium hydroxide (TMAH) aqueous solution for about 0.5 to 3 minutes by a dip method, a puddle method, a spray method, or the like conventional method, to form the desired pattern on the substrate.

As the developer used in various pattern forming methods, there can be used an aqueous alkali solution having a suitable concentration usually 0.01 to 20% so as to make the difference in solubility between exposed areas and non-exposed areas large depending on solubility of the resist material. As the aqueous alkali solution, there can be use an aquous solution containing an organic amine such as TMAH, choline, triethanol amine, or the like, or an inorganic alkali such as NaOH, KOH, etc.

Since the polymer of the present invention used in the resist material has a small degree of dispersion, and contains the monomer unit of the formula [3] containing the functional group of the formula [2], it can release the functional group more easily in the presence of an acid to be converted to alkali-soluble compared with the conventional polymers used for the same purpose (polymers having as monomer unit e.g. tert-butoxycarbonyloxystyrene, tetrahydropyranyloxystyrene, tert-butoxystyrene, tert-butoxycarbonylmethoxystyrene, etc.), so that it is possible to obtain high resolution and to maintain a stable pattern dimension during a period from the exposure to light to heat treatment (baking). Further, the polymer of the present invention contains the hydroxystyrene unit of the formula [4], so that the polymer is excellent in heat resistance, resistance to dry etching and adhesiveness to the substrate. In addition, the polymer of the present invention can contain the monomer unit of the formula [5], so that there can be obtained enlargement of focus margin, improvement of mask linearity and inhibition of influence of proximity effect due to control of developing rate at exposed areas.

A polymer having repeating units of the formula [1] is known and can be obtained by radical polymerization, but it has a large degree of dispersion. When such a known polymer is used in a resist material, the resolution and maintenance of pattern size are as good as the present invention, but with a finer rule of the pattern dimension, there arises a problem in the shape of pattern sidewalls due to a larger difference in developing rate between molecules at the time of development. In contrast, when the polymer of the present invention having a smaller degree of dispersion is used in the resist material, the shape of pattern sidewalls is bettered due to control of difference in developing rate between molecules, although the properties such as the maintenance of pattern size are equal to those of the known polymers. In addition, heat resistance is also improved compared with the case of using known polymers.

When one or more polymers having repeating units of the formula [1] and a small degree of dispersion are mixed with a photoacid generator, various problems of the prior art in the resist pattern formation using deep ultraviolet light such as KrF excimer laser beams can be solved. Further, there can provide a resist material having various good properties and suitable for deep ultraviolet light and KrF excimer laser beams.

When the polymer having repeating units of the formula [1] and a small degree of dispersion is mixed with two or more special photoacid generators as mentioned above, the resulting resist material is effective for removing undesirable shape at bottom portions of the pattern and scums. The combination of a photoacid generator of the formula [16] and a photoacid generator of the formula [17], [18], [20], [21] or [22] is more preferable for giving better results.

The resist material of the present invention can be used for not only deep ultraviolet light and KrF excimer laser beams, but also i-line light, electron beams, soft X-rays, and the like actinic radiation, for generating an acid and exhibiting chemical amplifying function.

Reaction mechanisms are explained below, when the resist material of the present invention is used. In the portion exposed to actinic radiation such as KrF excimer laser beams, deep ultraviolet light, etc., an acid is generated by photo reaction as shown in Equation 1, 2 or 3:

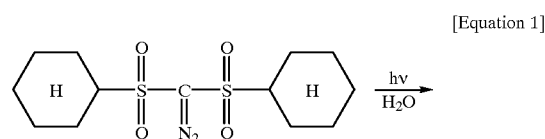

[Equation 1]

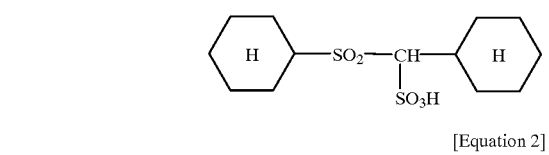

[Equation 2]

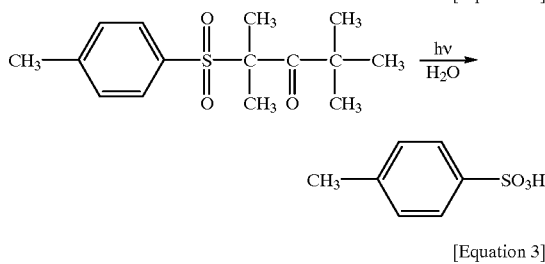

[Equation 3]

By heat treatment subsequent to the light exposure step, the special functional group (the 1-ethoxyethoxy group in Equation 4) of the polymer of the present invention becomes a hydroxyl group by a chemical change caused by the acid to make the polymer alkali-soluble at the time of development, resulting in dissolving in the developer.

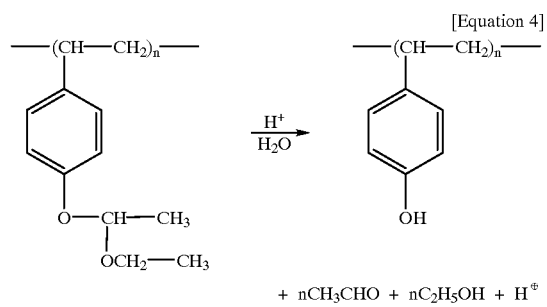

[Equation 4]

On the other hand, since no acid is generated in non-exposed portion, no chemical change takes place even if subjected to heat treatment. Rather, the photoacid generator protects the hydrophilic moiety of the polymer used for stengthening adhesiveness to the substrate from the wetting of the alkali developer. As mentioned above, when a pattern is formed by using the resist material of the present invention, since there arises a large difference in solubility between the exposed portion and the non-exposed portion against the alkali developer, there can be obtained a positive-work pattern having good contrast due to strong adhesiveness to the substrate of the polymer in the non-exposed portion without causing peeling of the film at the time of development. Further, since the acid generated upon exposure to actinic radiation functions catalytically as shown in Equation 4, the amount of exposed light is sufficient only to generate the acid, resulting in reducing the light exposure energy amount.

The present invention is explained further in detail referring to Examples, in which all parts and percents are by weight, unless otherwise specified.

A part of polymer, photoacid generators, and ultraviolet absorbents used in the following Examples are synthesized by, e.g. JP-A-4-210960 (=U.S. Pat. No. 5,216,135), JP-A-4-211258 (=U.S. Pat. No. 5,350,660 and EP 0,440,374), JP-A-5-249682 (=E.P. 0,520,642), JP-A-4-251259, Y. Endo et al.: Chem. Pharm. Bull., 29(12), 3753 (1981), M. Desbois et al.: Bull. Chim. Soc, France, 1974, 1956 (1974), or C. D. Beard et al.: J. Org. Chem, 38, 3673 (1973), these references being incorporated by reference.

PRODUCTION EXAMPLE 1

Synthesis of poly(p-1-ethoxyethoxystyrene/p-hydroxystyrene)

(1) Poly(p-tert-butoxystyrene) [mfd. by Nippon Soda Co., Ltd.; Mw about 21,000; Molecular weight distribution (degree of dispersion) 1.16] in an amount of 15.9 g was suspended in isopropanol and added with 30 ml of concentrated hydrochloric acid, followed by reflux with stirring for 4 hours. After cooling, the reaction solution was poured into 3000 ml of water for crystallization. The deposited crystals were filtered, washed with water and dried under reduced pressure to give 10.5 g of white powdered crystals of poly(p-hydroxystyrene).

(2) The poly(p-hydroxystyrene) obtained in above (1) in an amount of 8 g and 2.4 g of ethyl vinyl ether were dissolved in 80 ml of ethyl acetate. After adding a catalytic amount of p-toluenesulfonate pyridinium salt, the reaction was carried out at room temperature with stirring for 2 hours. After the reaction, the reaction solution was concentrated under reduced pressure at room temperature, and the residue was dissolved in 30 ml of acetone. The resulting solution was poured into 2000 ml of water to deposit crystals. The deposited crystals were filtered, washed with water and dried under reduced pressure to give 9.2 g of white powdered crystals of poly(p-1-ethoxyethoxystyrene/p-hydroxystyrene). The proportion of the p-1-ethoxyethoxystyrene unit and the p-hydroxystyrene unit of the obtained polymer was about 35:65 measured by $^1$H NMR. The result of GPC measurement using polystyrene as standard was shown in FIG. 1, which shows Mw of about 18,000 and the degree of dispersion of 1.16.

PRODUCTION EXAMPLE 2

Synthesis of poly(P-1-methoxyethoxystyrene/p-hydroxystyrene)

Poly(p-hydroxystyrene) in an amount of 8 g obtained in the same manner as described in Production Example 1 (1) and 2.2 g of methyl vinyl ether were reacted and after-treated in the same manner as described in Production Example 1(2) to give 8.6 g of white powdered crystals of poly(p-1-methoxyethoxystyrene/p-hydroxystyrene). The proportion of the p-1-methoxyethoxystyrene unit and the p-hydroxystyrene unit of the obtained polymer was about 4:6 measured by $^1$H NMR. Mw was about 17,000 and the degree of dispersion was 1.16 (GPC method, polystyrene standard).

PRODUCTION EXAMPLE 3

Synthesis of poly(p-1-ethoxyethoxystyrene/p-hydroxystyrene/p-isobutoxycarbonyloxystyrene)

(1) Poly(p-hydroxystyrene) [mfd. by Nippon Soda Co., Ltd., Mw about 8200, the degree of dispersion 1.05] in an amount of 18.0 g was dissolved in 70 ml of ethyl acetate. Then, 3.5 g of isobutyl dicarbonate synthesized from isobutyl chlorocarbonate and 3.0 g of triethylamine were added and the reaction was carried out at room temperature for 4 hours. After the reaction, the ethyl acetate was removed by distillation under reduced pressure and the residue was dissolved in 70 ml of acetone. After pouring 1000 ml of water, crystals were deposited. The deposited crystals were filtered, washed with water and dried under reduced pressure to give 13.5 g of white powdered crytals of poly(p-hydroxystyrene/p-isobutoxycarbonyloxystyrene). The proportion of the p-hydroxystyrene unit and the p-isobutoxycarbonylcarbonyloxystyrene unit was about 92:8 by the $^1$H NMR measurement.

(2) The poly(p-hydroxystyrene/p-isobutoxycarbonyloxstyrene) obtained in above (1) in an amount of 11.4 g and 2.5 g of ethyl vinyl ether were reacted and after-treated in the same manner as described in Production Example 1(2) to give 8.5 g of white powdered crystals of poly(p-1-ethoxyethoxystyrene/p-hydroxystyrene/p-isobutoxycarbonyloxystyrene). The proportion of the p-1-ethoxyethoxystyrene unit, the p-hydroxystyrene unit and the p-isobutoxycarbonyloxystyrene unit was about 28:64:8 by the $^1$H NMR measurement. Mw was about 10,200 and the degree of dispersion was 1.05 (GPC method, polystyrene standard).

PRODUCTION EXAMPLE 4

Synthesis of poly(p-1-ethoxyethoxystyrene/p-hydroxystyrene/p-tert-butoxystyrene)

(1) Poly(p-tert-butoxystyrene) obtained in the same manner as described in Production Example 1(1) in an amount of 15.0 g was suspended in isopropanol and added with 15 ml of concentrated hydrochloric acid. The reaction was carried out at 70° to 80° C. for 4 hours with stirring. After cooling, the reaction solution was poured into 1000 ml of water to deposit crystals. The deposited crystals were filtered, washed with water and dried under reduced pressure to give 9.4 g of white powdered crystals of poly(p-hydroxystyrene/p-tert-butoxystyrene). The proportion of the p-hydroxystyrene unit and the p-tert-butoxystyrene unit of the obtained polymer was about 30:64:6 measured by $^1$H NMR. Mw was about 17,500 and the degree of dispersion was 1.16 (GPC method, polystyrene standard).

PRODUCTION EXAMPLE 5

Synthesis of poly(p-1-ethoxyethoxystyrene/p-hydroxystyrene)

Poly(p-hydroxystyrene) [mfd. by Nippon Soda Co., Ltd., Mw about 8,200, the degree of dispersion 1.05] in an amount of 8.0 g and 2.4 g of ethyl vinyl ether were reacted and after-treated in the same manner as described in Production Example 1(2) to give 9.2 g of white powdered crystals of poly(p-1-ethoxyethoxystyrene/p-hydroxystyrene). The proportion of the p-1-ethoxyethoxystyrene unit and the p-hydroxystyrene unit of the obtained polymer was about 38:62 by the $^1$H NMR measurement. Mw was about 10,200 and the degree of dispersion was 1.05 (GPC method, polystyrene standard).

PRODUCTION EXAMPLE 6

Synthesis poly(p-1-methoxy-1-methylethoxystyrene/p-hydroxystyrene)

Poly(p-hydroxystyrene) obtained in the same manner as described in Production Example 5(1) in an amount of 8.0 g and 2.4 g of 2-methoxy-1-propene were dissolved in 80 ml of tetrahydrofuran and added with a catalytic amount of phosphorus oxychloride. The reaction was carried out at room temperature with stirring for 16 hours. After the reaction, the reaction solution was poured into 4000 ml of water to deposit crystals. The deposited crystals were filtered, washed with water, and dried under reduced pressure to give 6.8 g of white powdered crystals of poly(p-1-methoxy-1-methylethoxystyrene/p-hydroxystyrene). The proportion of the p-1-methoxy-1-methylethoxystyrene unit and the p-hydroxystyrene unit of the obtained polymer was about 40:60 by the measurement of $^1$H NMR. Mw was about 10,200 and the degree of dispersion was 1.05 (GPC method, polystyrene standard).

PRODUCTION EXAMPLE 7

Synthesis of poly(p-1-ethoxyethoxystyrene/p-hydroxystyrene)

(1) p-tert-Butoxystyrene in an amount of 17.6 g was dissolved in 30 ml of isopropanol and added with a catalytic amount of 2,2'-azobis(2,4-dimethylvaleronitrile). The reaction was carried out in a nitrogen stream at 55° to 60° C. for 6 hours with stirring. After cooling, the reaction solution was poured into 300 ml of methanol. After allowing to stand at room temperature overnight, a supernatant was removed by decantation. The residual viscous oily material was dissolved in 20 ml of acetone, followed by pouring into 200 ml of methanol. A supernatant was removed by decantation. The same procedures were repeated again to deposit crystals. The deposited crystals were filtered and dried under reduced pressure to give 14.1 g of white powdered crystals of poly(p-tert-butoxystyrene). Mw was about 21,000 and the degree of dispersion was 1.30.

(2) The poly(p-tert-butoxystyrene) obtained in above (1) in an amount of 12.5 g was subjected to the reaction and after-treatment in the same manner as described in Production Example 1(1) to give 7.5 g of white powdered crystals of poly(p-hydroxystyrene). Mw was about 14,300 and the degree of dispersion was 1.27.

(3) The poly(p-hydroxystyrene) obtained in above (2) in an amount of 7.0 g and 2.1 g of ethyl vinyl ether were reacted and after-treated in the same manner as described in Production Example 1(2) to give 8.0 g of white powdered crystals of poly(p-1-ethoxyethoxystyrene/p-hydroxystyrene). The proportion of the p-1-ethoxyethoxystyrene unit and the p-hydroxystyrene unit of the obtained polymer was about 37:63 by the measurement of $^1$H NMR. Mw was about 17,500, and the degree of dispersion was 1.26 (GPC method, polystyrene standard).

PRODUCTION EXAMPLE 8

Synthesis of poly(p-1-ethoxyethoxystyrene/p-hydroxystyrene/p-tert-butoxystyrene)

(1) p-Acetoxystyrene in an amount of 130.0 g (0.80 mole) and 24.9 g (0.14 mole) were dissolved in 220 ml of toluene and added with a catalytic amount of 2,2'-azobis(2,4-dimethylvaleronitrile). The reaction was carried out in a nitrogen stream at 60° to 65° C. for 5 hours with stirring. After cooling, the reaction solution was poured into 2300 ml of methanol and allowed to stand at room temperature overnight. A supernatant was removed by decantation. Then, the residual viscous oily material was dissolved in 100 ml of acetone and poured into 800 ml fo methanol. Then, a supernatant was removed by decantation. The above-mentioned procedures were repeated again. The deposited crystals were filterred and dried under reduced pressure to give 105.0 g of white powdered crystals of poly(p-acetoxystyrene/p-tert-butoxystyrene). The proportion of the p-acetoxystyrene unit and the p-tert-butoxystyrene unit of the obtained polymer was about 85:15 by the measurement of $^1$H NMR. Mw was about 17,500 and the degree of dispersion was 1.42 (GPC method, polystyrene standard).

(2) The poly(p-acetoxystyrene/p-tert-butoxystyrene) obtained in above (1) in an amount of 58.0 g was added to 460 ml of methanol and added with 234 g of aqueous solution of 15% tetramethylammonium hydroxide. The reaction was carried out by refluxing with stirring for 4 hours. After reaction, the reaction solution was cooled to room temperature and allowed to stand at room temperature overnight. Then, 12.9 g of glacial acetic acid was dropped into the reaction solution, neutralized and concentrated under reduced pressure. The concentrated residue was poured into 4000 ml of water to deposit crystals. The deposited crystals were filtered and dissolved in 60 ml of acetone, followed by pouring into 2000 ml of water to deposit crystals. The deposited crystals were filtered and dried under reduced pressure to give 38.6 g of white powdered crystals of poly(p-hydroxystyrene/p-tert-butoxystyrene). The proportion of the p-hydroxystyrene unit and the p-tert-butoxystyrene unit of the obtained polymer was about 85:15 by the measurement of $^1$H NMR. Mw was about 13,500 and the degree of dispersion was 1.40 (GPC method, polystyrene standard).

(3) the poly(p-hydroxystyrene/p-tert-butoxystyrene) obtained in above (2) in an amount of 8 g and 1.1 g of ethyl vinyl ether were reacted and after-treated in the same manner as described in Production Example 4(2) to give 8.8 g of white powdered crystals of poly(p-1-ethoxyethoxystyrene/p-hydroxystyrene/p-tert-butoxystyrene). The proportion of the p-1-ethoxyethoxystyrene unit, the p-hydroxystyrene unit and the p-tert-butoxystyrene unit in the obtained polymer was about 20:65:15 by the measrement of $^1$H NMR. Mw was about 14,200 and the degree of dispersion was 1.39 (GPC method, polystyrene standard).

PRODUCTION EXAMPLE 9
(Comparison)

Synthesis of p-cresol/m-cresol/formaldehyde resin (Mw=4000)

To a mixed solution of 30 g (0.28 mole) of p-cresol, 30 g (0.28 mole) of m-cresol, 1.0 g of oxalic acid dihydrate and 2 ml of water, 27.0 g of aqueous solution of 37% formaldehyde was dropped at 100° C. with stirring, followed by reaction at 100°±5° C. for 4 hours with stirring. After reaction, 1000 ml of water was poured into the reaction solution for deposition. A supernatant was removed by decantation. The deposited material was dissolved in 60 ml of acetone, followed by pouring of 600 ml of water for deposition. After removing a supernatant by decandation, the deposited material was concentrated under reduced pressure to dryness to give 40.5 g of pale white waxy crystals of p-cresol/m-cresol/formaldehyde resin. Mw was about 4000 and the degree of dispersion was 3.53 (GPC method, polystyrene standard).

PRODUCTION EXAMPLE 10
(Comparison)

Synthesis of p-cresol/1,4-dihydroxymethybenzene resin p-Cresol in an amount of 38.4 g (0.36 mole) and 35.0 g (0.25 mole) of xylene-α,α-diol were dissolved with heating, followed by addition of 0.15 g of methanesulfonic acid at 90° to 100° C. The reaction was carried out at 90° to 100° C. for 2 hours with stirring. After cooling, 100 ml of acetone was poured into the reaction solution. After dissolving, the reaction solution was poured into 2000 ml of water and stirred. After allowed to stand, a supernatant was removed by decantation. The residue was dissolved in 100 ml of acetone, followed by pouring into 2000 ml of water and stirring. After allowed to stand, a supernatant was removed by decantation. The residue was dried under reduced pressure to give 65.0 g of pale yellowish powdered crystals of p-cresol/1,4-dihydroxymethylbenzene polycondensate. Mw was about 6,700 and the degree of dispersion was 3.50 (GPC method, polystyrene standard).

PRODUCTION EXAMPLE 11

Synthesis of poly(p-1-ethoxyethoxystyrene/p-hydroxystyrene/tert-butyl methacrylate)

(1) p-tert-Butoxystyrene purified in a nitrogen stream in an amount of 15.9 g (90 millimoles) and 17.1 g (12 millimoles) of tert-butyl methacrylate were dissolved in 90 ml of dried tetrahydrofuran, followed by pouring into 250 ml of dried tetrahydrofuran containing n-butyllithium (3.0 millimoles) in a nitrogen stream at −78° to −70° C. The reaction was carried out at −78° to −70° C. for 1 hour with stirring. After stopping the reaction by pouring 30 ml of methanol, the reaction solution was poured into 1000 ml of methanol at room temperature. The deposited viscous oily material was separated, washed with methanol and concentrated under reduced pressure to give 15.6 g of white powdered crystals of poly(p-tert-butoxystyrene/tert-butyl methacrylate). Mw was about 12,000 and the degree of dispersion was 1.12 (GPC method, polystyrene standard).

(2) The poly(p-tert-butoxystyrene/tert-butyl methacrylate) obtained in above (1) in an amount of 14.0 g was reacted and after-treated in the same manner as described in Production Example 1(1) to give 9.4 g of white powdered crystals of poly(p-hydroxystyrene/tert-butyl methacrylate). The proportion of the p-hydroxystyrene unit and the tert-butyl methacrylate of the obtained polymer was about 9:1 by the measurement of $^1$H NMR. Mw was about 8,500 and the degree of dispersion was 1.12 (GPC method, polystyrene standard).

(3) The poly(p-hydroxystyrene/tert-butyl methacrylate) obtained in above (2) in an amount of 8.0 g and 1.5 g of ethyl vinyl ether were reacted and after-treated in the same manner as described in Production Example 1(2) to give 8.6 g of white powdered crystals of poly(p-1-ethoxyethoxystyrene/p-hydroxystyrene/tert-butyl methacrylate). The proportion of the p-1-ethoxyethoxystyrene unit, the p-hydroxystyrene unit and the tert-butyl methacrylate unit of the obtained polymer was about 25:65:10 measured by $^1$H NMR. Mw was 10,000 and the degree of dispersion was 1.12 (GPC method, polystyrene standard).

PRODUCTION EXAMPLE 12

Synthesis of poly(p-1-ethoxyethoxystyrene/p-hydroxystyrene/acrylonitrile)

(1) p-tert-butoxystyrene in an amount of 15.9 g (90 millimoles) and 0.8 g (15 millimoles) of acrylonitrile were reacted and after-treated in the same manner as described in Production Example 11(1) to give 14.8 g of white powdered crystals of poly(p-tert-butoxystyrene/acrylonitrile). The proportion of the p-tert-butoxystyrene unit and the acrylonitrile unit of the obtained polymer was about 9:1 by the measurement of $^1$H NMR. Mw was about 12,000 and the degree of dispersion was 1.15 (GPC method, polystyrene standard).

(2) The poly(p-tert-butoxystyrene/acrylonitrile) obtained in above (1) in an amount of 13.5 g was reacted and after-treated in the same manner as described in Production Example 1(1) to give 8.9 g of white powdered crystals of poly(p-hydroxystyrene/acrylonitrile). Mw was about 8,300 and the degree of dispersion was 1.12 (GPC method, polystyrene standard).

(3) The poly(p-hydroxystyrene/acrylonitrile) obtained in above (2) in an amount of 8.0 g was reacted and after-treated in the same manner as described in Production Example 1(2) to give 8.6 g of white powdered crystals of poly(p-1-ethoxyethoxystyrene/p-hydroxystyrene/acrylonitrile). The proportion of the p-1-ethoxyethoxystyrene unit, the p-hydroxystyrene unit and the acrylonitrile unit was about 25:65:10 by the measurement of $^1$H NMR. Mw was about 9,800 and the degree of dispersion was 1.12 (GPC method, polystyrene standard).

PRODUCTION EXAMPLE 13

Synthesis of poly(p-1-ethoxyethoxystyrene/p-hydroxystyrene/p-tert-butoxycarbonyloxystyrene)

(1) The same poly(p-hydroxystyrene) as used in Production Example 3 in an amount of 16.2 g was dissolved in 60 ml of ethyl acetate, and added with 3.0 g of di-tert-butyl dicarbonate and 2.7 g of triethylamine. The reaction was carried out at room temperature for 4 hours with stirring. After the reaction, the ethyl acetate was removed by distillation under readauced pressure. The residue was dissolved in 80 ml of acetone and poured into 1000 ml of water to deposit crystals. The deposited crystals were filtered, washed with water and dried under reduced pressure to give 15.5 g of white powdered crystals of poly(p-hydroxystyrene/p-tert-butoxycarbonyloxystyrene). The proportion of the p-hydroxystyrene unit and the p-tert-butoxycarbonyloxystyrene unit of the obtained polymer was about 92:8 by the measurement of $^1$H NMR. Mw was about 8,800 and the degree of dispersion was 1.05 (GPC method, polystyrene standard).

(2) The poly(p-hydroxystyrene/p-tert-butoxycarbonyloxystyrene) obtained in above (1) in an amount of 14.0 g and 2.8 g of ethyl vinyl ether were reacted and after-treated in the same manner as described in Production Example 1(2) to give 14.0 g of white powdered crystals of poly(p-1-ethoxyethoxystyrene/p-hydroxystyrene/p-tert-butoxycarbonyloxystyrene). The proportion of the p-1-ethoxyethoxystyrene unit, the p-hydroxystyrene unit and the p-tert-butoxycarbonyloxystyrene unit was about 30:62:8 by the measurement of $^1$H NMR. Mw was about 10,300 and the degree of dispersion was 1.05 (GPC method, polystyrene standard).

REFERENCE EXAMPLE 1

Synthesis of poly(p-tert-butoxystyrene/p-hydroxystyrene)

Poly(p-tert-butoxystyrene) [mfd. by Nippon Soda Co., Ltd., Mw=about 21,000, the degree of dispersion=1.16] in an amount of 15.0 g was dissolved in 150 ml of 1,4-dioxane. After adding 10 ml of concentrated hydrochloric acid, the reaction was carried out at 80° to 85° C. for 3 hours with stirring. After the reaction, the reaction solution was poured into 1000 ml of water to deposit crystals. The deposited crystals were filtered, washed with water and dried under reduced pressure to give 9.8 g of white powdered crystals of poly(p-tert-butoxystyrene/p-hydroxystyrene). The proportion of the p-tert-butoxystyrene unit and the p-hydroxystyrene unit of the obtained polymer was about 30:70 by the measurement of $^1$H NMR. Mw was about 16,000 and the degree of dispersion was 1.16 (GPC method, polystyrene standard).

REFERENCE EXAMPLE 2

Synthesis of poly(p-tetrahydropyranyloxystyrene/p-hydroxystyrene)

Poly(p-hydroxystyrene) [mfd. by Nippon Soda Co., Ltd., Mw=about 8,200, the degree of dispersion=1.05] in an amount of 9.0 g was dissolved in 100 ml of 1,2-dimethoxyethane, followed by addition of 12.6 g of 2,3-dihydropyrane and 0.5 ml of sulfuric acid. The reaction weas carried out at 30° to 40° C. for 15 hours with stirring. After the reaction, the reaction solution was concentrated under reduced pressure. The residue was neutralized with sodium carbonate and poured into 1000 ml of water to deposit crystals. The deposited crystals were filtered, washed with water and dried under reduced pressure to give 11.0 g of white powdered crystals of poly(p-tetrahydropyranyloxystyrene/p-hydroxystyrene). The proportion of the p-tetrahydropyranyloxystyrene unit and the p-hydroxystyrene unit of the obtained polymer was about 35:65 by the measurement of $^1$H NMR. Mw was about 10,000 and the degree of dispersion was 1.05 (GPC method, polystyrene standard).

REFERENCE EXAMPLE 3

Synthesis of poly(p-tert-butoxycarbonyloxystyrene/ p-hydroxystyrene)

The same poly(p-hydroxystyrene) as used in Reference Example 2 in an amount of 9.0 g, 5.3 g of di-tert-butyl dicarbonate and 9.0 g of triethylamine were reacted and after-treated in the same manner as described in Production Example 13(1) to give 10.1 g of white powdered crystals of poly(p-tert-butoxycarbonyloxystyrene/p-hydroxystyrene). The proportion of the p-tert-butoxycarbonyloxystyrene unit and the p-hydroxystyrene unit of the obtained polymer was about 3:7 by the measurement of $^1$H NMR. Mw was about 10,300 and the degree of dispersion was 1.05 (GPC method, polystyrene standard).

EXAMPLE 1

A photoresist material having the following composition was prepared.

| | |
|---|---|
| Poly(p-1-ethoxyethoxystyrene/p-hydroxy styrene) [Polymer of Production Example (Pro. Ex.) 1] | 6.0 g |
| Bis(1,1-dimethylethylsulfonyl)diazo- methane | 0.2 g |
| Bis(p-toluenesulfonyl)diazomethane | 0.1 g |
| Propylene glycol monomethyl ether acetate | 23.7 g |

Figure 2A:
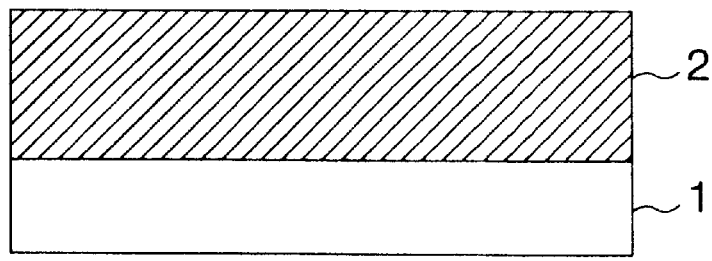
FIGS. 2A to 2C are cross-sectional views showing a process for forming a positive work pattern using the resist material of the present invention.
Figure 2B:
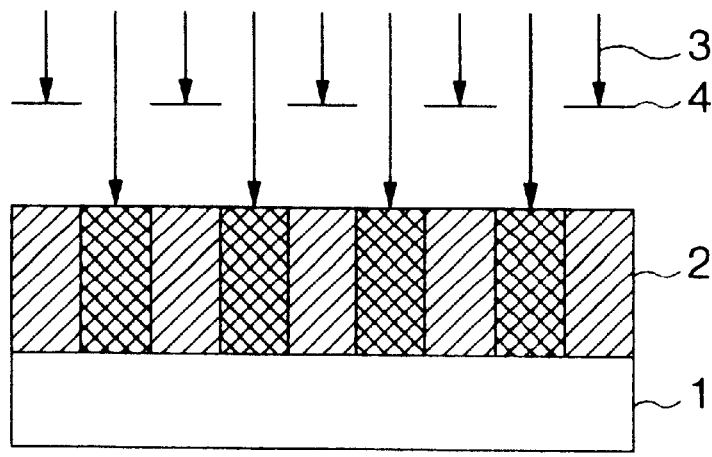
Figure 2C:
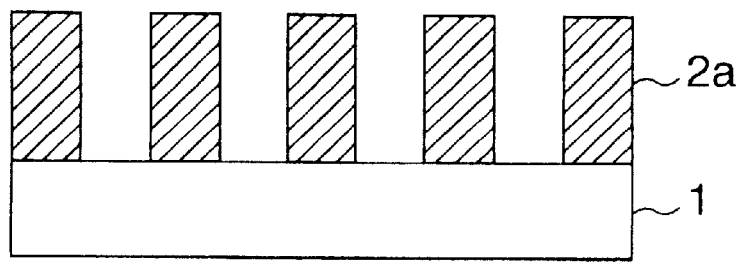

A pattern formation process using the above-mentioned resist material is explained referring to FIGS. 2A to 2C.

On a silicon substrate 1, the above-mentioned resist material 2 was spin coated and prebaked at 90° C. for 90 seconds on a hot plate to obtain a resist material film of 1.0 μm thick (FIG. 2A). Then, the resist material film was selectively exposed to KrF excimer laser beams 3 of 248.4 nm through a mask 4 using KrF excimer laser stepper (NA 0.55) (FIG. 2B). After hot baking at 100° C. for 90 seconds on a hot plate, the resist material film was developed with an alkali developing solution (aqueous solution of 2.38% tetramethylammonium hydroxide) for 60 seconds to dissolve and remove only exposed area of the resist material. As a result, a positive type pattern 2a was obtained (FIG. 2C). The resulting positive type pattern had a rectangular shape with a resolution of line/space of 0.20 μm. The exposure amount was 24 mJ/cm$^2$.

Heat resistance of the resist material was mesured as follows.

After exposure and development of the resist material, it was baked on a hot plate at 125° C. for 150 minutes, followed by observation of line/space of 0.25 μm for measuring the dimension. As a result, a rectangular shape of line/space of 0.25 μm was resolved to admit heat resistance of the resist film.

The pattern dimentional change with the lapse of time from the exposure to light to the heat treatment (post baking) of the resist material was measured. The line/space of 0.25 μm was resolved even after 3 hours without any problem.

Figure 3:
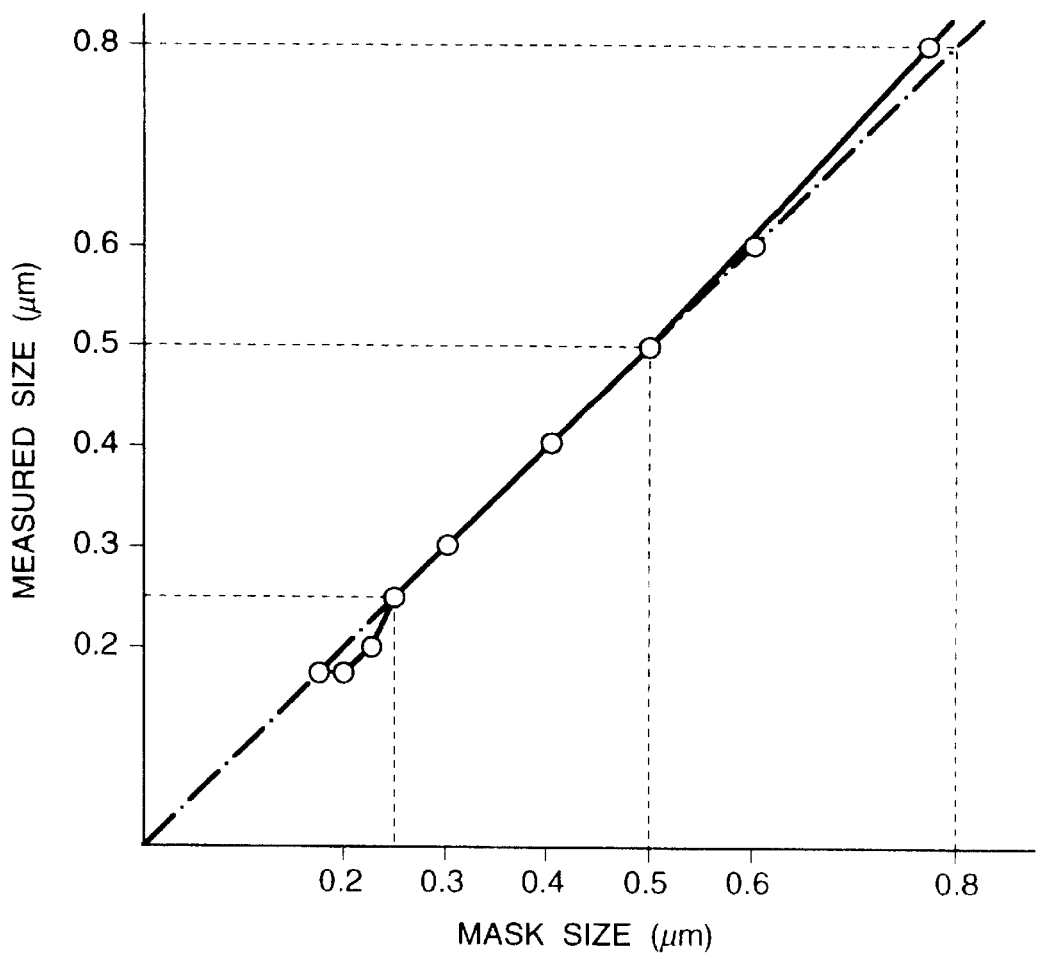
FIG. 3 is a graph showing a good mask linearity of the resist material obtained in Example 1.
Figure 4:
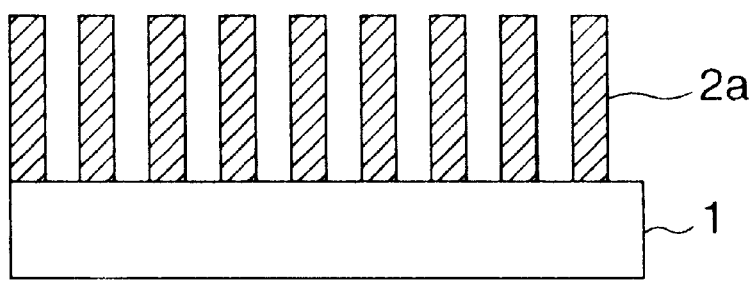
FIG. 4 is a cross-sectional view of the good pattern obtained in Example 1.

Further, as shown in FIG. 3, when the resist material of the present invention was used, the mask linearity was good until 0.25 μm. In addition when exposed to light by defocus, no deterioration of shape was admitted by ±0.7 μm against the line/space of 0.25 μm. This means that a sufficient focus margin was obtained. The pattern shape was as shown in FIG. 4, wherein the pattern sidewalls were smooth and no scum was observed.

When the resist material of the present invention was stored at 23° C. for 1 month and subjected to pattern formation in the same manner as described above, a positive type pattern with the line/space of 0.20 μm was resolved. Thus, the storage stability was good.

EXAMPLES 2 TO 22

Various photoresist materials as shown in Tables 1 to 8 were prepared.

TABLE 1

| | | |
|---|---|---|
| Example 2 | Poly(p-1-methoxyethoxystyrene/p-hydroxystyrene) [Polymer of Pro. Ex. 2] | 6.0 g |
| | Bis(1-methylethylsulfonyl)diazomethane | 0.2 g |
| | Bis(benzensulfonyl)diazomethane | 0.1 g |
| | Propylene glycol monomethyl ether acetate | 23.7 g |
| Example 3 | Poly(p-1-methoxy-1-methylethoxystyrene/ p-hydroxystyrene [Polymer of Pro. Ex. 6] | 6.0 g |
| | Bis(cyclohexylsulfonyl)diazomethane | 0.2 g |
| | Benzoylbenzenesulfonyldiazomethane | 0.1 g |
| | Propylene glycol monomethyl ether acetate | 23.7 g |
| Example 4 | Poly(p-1-ethoxyethoxystyrene/p-hydroxy- styrene) [Polymer of Pro. Ex. 1] | 4.5 g |
| | Poly(p-1-ethoxyethoxystyrene/p-hydroxy- styrene) [Polymer of Pro. Ex. 5] | 1.5 g |
| | Bis(1,1-dimethylethylsulfonyl)- diazomethane | 0.3 g |
| | N,N-dimethylpropionamide | 0.3 g |
| | Propylene glycol monomethyl ether acetate | 23.4 g |
| Example 5 | Poly(p-1-ethoxyethoxystyrene/p-hydroxy- styrene/p-isobutoxy carbonyloxystyrene) [Polymer of Pro. Ex. 3] | 6.0 g |
| | Bis(cyclohexylsulfonyl)diazomethane | 0.2 g |
| | Bis(p-toluenesulfonyl)diazomethane | 0.1 g |
| | Propylene glycol monomethyl ether acetate | 23.7 g |

TABLE 2

| | | |
|---|---|---|
| Example 6 | Poly(p-1-ethoxyethoxystyrene/p-hydroxy- styrene/p-tert-butoxystyrene) {Polymer of Pro. Ex. 4] | 6.0 g |
| | Bis(cyclohexylsulfonyl)diazometane | 0.2 g |
| | Triphenylsulfonium trifluoromethane- sulfonate | 0.1 g |
| | 9-Diazo-10-phenanthrone | 0.1 g |
| | Propylene glycol monomethyl ether acetate | 23.6 g |
| Example 7 | Poly-(p-1-ethoxyethoxystyrene/p-hydroxy- styrene) [Polymer of Pro. Ex. 5] | 6.0 g |
| | Bis(cyclohexylsulfonyl)diazomethane | 0.4 g |
| | 2,2',4,4'-tetrahydroxybenzophenone | 0.1 g |
| | N,N-dimethyloacetamide | 0.2 g |
| | Trioctylamine | 0.1 g |
| | Propylene glycol monomethyl ether acetate | 23.2 g |
| Example 8 | Poly(p-1-ethoxyethoxystyrene/p-hydroxy styrene/p-isobutoxycarbonyloxystyrene) [Polymer of Pro. Ex. 3] | 4.5 g |
| | Poly(p-1-ethoxyethoxystyrene/p-hydroxy- styrene) [Polymer of Pro. Ex. 5] | 1.5 g |
| | Bis(cyclohexylsulfonyl)diazomethane | 0.3 g |

TABLE 2-continued

| | | |
|---|---|---|
| | 2-p-Toluenesulfonyl-2-cyclohexylcarbonyl-propane | 0.1 g |
| | Methyl 3-methoxypropionate | 23.6 g |

TABLE 3

| | | |
|---|---|---|
| Example 9 | Poly(p-1-methoxyethoxystyrene/p-hydroxystyrene) [Polymer of Pro. Ex. 2] | 6.0 g |
| | Bis(1,1-dimethylethylsulfonyl)diazomethane | 0.3 g |
| | Bis(p-toluenesulfonyl)diazomethane | 0.1 g |
| | 9-Diazo-10-phenanthrone | 0.2 g |
| | Propylene glycol monomethyl ether acetate | 23.4 g |
| Example 10 | Poly(p-1-ethoxyethoxystyrene/p-hydroxystyrene/p-tert-butoxystyrene) [Polymer of Pro. Ex. 4] | 4.0 g |
| | Poly(p-1-ethoxyethoxystyrene/p-hydroxystyrene) [Polymer of Pro. Ex. 2] | 2.0 g |
| | Bis(cyclohexylsulfonyl)diazomethane | 0.3 g |
| | Bis(2,4-dimethylbenzylsulfonyl)diazomethane | 0.1 g |
| | N,N-dimethylpropyonamide | 0.3 g |
| | Propylene glycol monomethyl ether acetate | 23.3 g |

TABLE 4

| | | |
|---|---|---|
| Example 11 | Poly(p-1-ethoxyethoxystyrene/p-hydroxystyrene) [Polymer of Pro. Ex. 1] | 6.0 g |
| | p-Cresol/m-cresol/formaldehyde polycondensate [Polycondensate of Pro. Ex. 9] | 0.6 g |
| | Bis(cyclohexylsulfonyl)diazomethane | 0.3 g |
| | Salicylic acid | 0.1 g |
| | 9-Diazofluorene | 0.1 g |
| | Fluorine-containing nonionic surfactant [Commercially available] | 0.1 g |
| | N,N-dimethylacetamide | 0.2 g |
| | Propylene glycol monomethyl ether acetate | 24.7 g |
| Example 12 | Poly(p-1-ethoxyethoxystyrene/p-hydroxystyrene) [Polymer of Pro. Ex. 1] | 6.0 g |
| | p-Cresol/m-cresol/formaldehyde polycondensate [Polycondensate of Pro. Ex. 9] | 0.5 g |
| | Bis(1,1-dimethylethylsulfonyl)diazomethane | 0.3 g |
| | o-Acetylbenzoic acid | 0.1 g |
| | 9-(2-Methoxyethoxy) methylanthracene | 0.1 g |
| | N,N-dimethylacetamide | 0.3 g |
| | Propylene glycol monomethyl ether acetate | 24.7 g |

TABLE 5

| | | |
|---|---|---|
| Example 13 | Poly(p-1-ethoxyethoxystyrene/p-hydroxystyrene) [Polymer of Pro. Ex. 1] | 6.0 g |
| | 2-Methyl-2,3,3-tri (p-hydroxyphenyl)propane | 0.5 g |
| | Bis(1,1-dimethylethylsulfonyl)diazomethane | 0.3 g |
| | Salicylic acid | 0.1 g |
| | Fluoreseine | 0.1 g |
| | Propylene glycol monomethyl ether acetate | 23.0 g |
| Example 14 | Poly(p-1-ethoxyethoxystyrene/p-hydroxystyrene/p-tert-butoxystyrene) | 6.0 g |
| | Bis(cyclohexylsulfonyl)diazomethane | 0.3 g |
| | 2,3,4-Tris(2,5-dichlorobenzenesulfonyloxy)acetophenone | 0.1 g |
| | Salicylic acid | 0.1 g |

TABLE 5-continued

| | | |
|---|---|---|
| | 9-Azofluorene | 0.1 g |
| | N,N-dimethylacetamide | 0.3 g |
| | Propylene glycol monomethyl ether acetate | 24.6 g |
| Example 15 | Poly(p-1-ethoxyethoxystyrene/P-hydroxytryrene/p-tert-butoxystyrene) | 6.0 g |
| | Bis(1,1-dimethylethylsulfonyl)diazomethane | 0.3 g |
| | Triphenylsulfonium trifluoromethanesulfonate | 0.1 g |
| | o-Acetylbenzoic acid | 0.1 g |
| | N,N-dimethylacetamide | 0.3 g |
| | Propylene glycol monomethyl ether acetate | 23.2 g |

TABLE 6

| | | |
|---|---|---|
| Example 16 | Poly(p-1-ethoxyethoxystyrene/p-hydroxystyrene) [Polymer of Pro. Ex. 7] | 6.0 g |
| | Bis(cyclohexylsulfonyl)diazomethane | 0.3 g |
| | Salicylic acid | 0.1 g |
| | Fluorine-containing nonionic surfactant [Commercially available] | 0.1 g |
| | Propylene glycol monomethyl ether acetate | 25.5 g |
| Example 17 | Poly(p-1-ethoxyethoxystyrene/p-hydroxystyrene/p-tert-butoxystyrene) [Polymer of Pro. Ex. 8] | 6.0 g |
| | Bis(cyclohexylsulfonyl)diazomethane | 0.3 g |
| | Triphenylsulfonium trifluoromethanesulfonate | 0.1 g |
| | 9-Diazofluorene | 0.1 g |
| | Propylene glycol monomethyl ether acetate | 25.5 g |
| Example 18 | Poly(p-1-ethoxyethoxystyrene/p-hydroxystyrene) [Polymer of Pro. Ex. 7] | 6.0 g |
| | p-Cresol/m-cresol/formaldehyde resin [Resin of Pro. Ex. 9] | 0.5 g |
| | Bis(cyclohexylsulfonyl)diazomethane | 0.3 g |
| | Fluorine-containing nonionic surfactant [Commercially available] | 0.1 g |
| | N,N-dimethylacetamide | 0.3 g |
| | Propylene glycol monomethyl ether acetate | 24.8 g |

TABLE 7

| | | |
|---|---|---|
| Example 19 | Poly(p-1-ethoxyethoxystyrene/p-hydroxystyrene) [Polymer of Pro. Ex. 7] | 6.0 g |
| | p-Cresol/1,4-dihydroxymethylbenzene resin [Resin of Pro. Ex. 10] | 0.5 g |
| | Bis(1,1-dimethylethylsulfonyl)diazomethane | 3 g |
| | Triphenylsulfonium trifluoromethanesulfonate | 0.1 g |
| | 9-Diazofluorene | 0.1 g |
| | Propylene glycol monomethyl ether acetate | 25.5 g |
| Example 20 | Poly(p-1-ethoxyethoxystyrene/p-hydroxystyrene/tert-butyl methacrylate) [Polymer of Pro. Ex. 11] | 6.0 g |
| | Bis(1,1-dimethylethylsulfonyl)diazomethane | 0.3 g |
| | Polyoxyethylene cetyl ether [Commercially available] | 0.1 g |
| | Salicylhydroxamic acid | 0.1 g |
| | Fluorine-containing nonionic surfactant [Commercially available] | 0.1 g |
| | N,N-dimethylacetamide | 0.3 g |
| | Propylene glycol monomethyl ether acetate | 25.5 g |

TABLE 8

| | | |
|---|---|---|
| Example 21 | Poly(p-1-ethoxyethoxystyrene/p-hydroxystyrene/acrylonitrile) [Polymer of Pro. Ex. 12] | 6.0 g |
| | 1-Benzylsulfonyl-1-methylsulfonyl-diazomethane | 0.1 g |
| | Bis(1,1-dimethylethylsulfonyl)-diazomethane | 0.3 g |
| | Polyoxyethylene lauryl ether [Commercially available] | 0.1 g |
| | Fluorine-containing nonionic surfactant [Commercially available] | 0.1 g |
| | Propylene glycol monometyl ether acetate | 25.5 g |
| Example 22 | Poly(p-1-ethoxyethoxystyrene/p-hydroxystyrene/p-tert-butoxy-carbonyloxystyrene) [Polymer of Pro. Ex. 13] | 6.0 g |
| | Bis(cyclohexylsulfonyl)diazomethane | 0.3 g |
| | Bis(2,4-dimethylbenzenesulfonyl)-diazomethane | 0.1 g |
| | Polypropylene glycol [Commercially available] | 0.1 g |
| | Perfluorooctanol [Commercially available] | 0.1 g |
| | N,N-dimethylacetamide | 0.3 g |
| | Trimethylamine | 0.1 g |
| | Propylene glycol monomethyl ether acetate | 25.5 g |

Using the above-mentioned resist materials, patterns were formed in the same manner as described in Example 1. The results are shown in Tables 9 and 10.

TABLE 9

| Example No. | Example dose (mJ/cm$^2$) | Limitative resolution | Time from exposure to heat treatment and resolution | |
|---|---|---|---|---|
| | | | Immediately after exposure | Hours later |
| 2 | 22 | 0.20 μm L/S | 0.25 μm L/S | 0.25 μm L/S |
| 3 | 28 | 0.20 μm L/S | 0.25 μm L/S | 0.25 μm L/S |
| 4 | 28 | 0.20 μm L/S | 0.25 μm L/S | 0.25 μm L/S |
| 5 | 25 | 0.22 μm L/S | 0.25 μm L/S | 0.25 μm L/S |
| 6 | 26 | 0.22 μm L/S | 0.25 μm L/S | 0.25 μm L/S |
| 7 | 33 | 0.20 μm L/S | 0.25 μm L/S | 0.25 μm L/S |
| 8 | 35 | 0.22 μm L/S | 0.25 μm L/S | 0.25 μm L/S |
| 9 | 28 | 0.20 μm L/S | 0.25 μm L/S | 0.25 μm L/S |
| 10 | 25 | 0.22 μm L/S | 0.25 μm L/S | 0.25 μm L/S |
| 11 | 22 | 0.20 μm L/S | 0.25 μm L/S | 0.25 μm L/S |
| 12 | 22 | 0.20 μm L/S | 0.25 μm L/S | 0.25 μm L/S |
| 13 | 22 | 0.20 μm L/S | 0.25 μm L/S | 0.25 μm L/S |
| 14 | 25 | 0.18 μm L/S | 0.25 μm L/S | 0.25 μm L/S |
| 15 | 25 | 0.18 μm L/S | 0.25 μm L/S | 0.25 μm L/S |
| 16 | 24 | 0.18 μm L/S | 0.25 μm L/S | 0.25 μm L/S |
| 17 | 25 | 0.18 μm L/S | 0.25 μm L/S | 0.25 μm L/S |
| 18 | 24 | 0.18 μm L/S | 0.25 μm L/S | 0.25 μm L/S |
| 19 | 22 | 0.18 μm L/S | 0.25 μm L/S | 0.25 μm L/S |
| 20 | 22 | 0.20 μm L/S | 0.25 μm L/S | 0.25 μm L/S |
| 21 | 22 | 0.20 μm L/S | 0.25 μm L/S | 0.25 μm L/S |
| 22 | 25 | 0.20 μm L/S | 0.25 μm L/S | 0.25 μm L/S |

TABLE 10

| Example No. | Focus margin 0.25 μm | Mask linearity ~0.25 μm | Shape of sidewalls of pattern | Heat resistance |
|---|---|---|---|---|
| 2 | ±0.7 | Good | Good | Good |
| 3 | ±0.7 | Good | Good | Good |
| 4 | ±0.7 | Good | Good | Good |
| 5 | ±0.7 | Good | Good | Good |
| 6 | ±0.7 | Good | Good | Good |
| 7 | ±0.7 | Good | Good | Good |
| 8 | ±0.7 | Good | Good | Good |
| 9 | ±0.7 | Good | Good | Good |
| 10 | ±0.7 | Good | Good | Good |
| 11 | ±0.7 | Good | Good | Good |
| 12 | ±0.7 | Good | Good | Good |
| 13 | ±0.7 | Good | Good | Good |
| 14 | ±0.7 | Good | Good | Good |
| 15 | ±0.7 | Good | Good | Good |
| 16 | ±0.7 | Good | Good | Good |
| 17 | ±0.7 | Good | Good | Good |
| 18 | ±0.7 | Good | Good | Good |
| 19 | ±0.7 | Good | Good | Good |
| 20 | ±0.7 | Good | Good | Good |
| 21 | ±0.7 | Good | Good | Good |
| 22 | ±0.7 | Good | Good | Good |

As is clear from the results shown in Tables 9 and 10, the same positive type patterns as in Example 1 were formed in Examples 2 to 22, and the line/space of 0.20 to 0.22 μm was resolved without any problem even after 3 hours of period from exposure to light on the SiO$_2$ to heat treatment (post baking) as in Example 1. Further, there was obtained the focus margin of ±0.7 μm or more against the line/space of 0.25 μm. In addition, the mask linearity was good until 0.25 μm. Further, pattern sidewalls were smooth and no scum was observed. There was no problem as to storage stability in Examples 2 to 22.

For comparison, resist materials were prepared by using polymers having a broad molecular weight distribution obtained by radical polymerization (e.g. disclosed in JP-A-4-211258 (=U.S. Pat. No. 5,350,660, JP-A-5-249682, etc.), monodisperse polymers obtained by living anion polymerization (e.g. disclosed in JP-A-6-273934, JP-A-6-49134, JP-A-4-195138, JP-A-5-132513, JP-A-7-268030, etc.) in place of monodisperse polymer of the present invention, and compared with the resist mateial of the present invention.

COMPARATIVE EXAMPLE 1

A resist material having the following composition was prepared.

| | |
|---|---|
| Poly(p-tert-butoxycarbonyloxystyrene/p-hydroxystyrene) [Mw = about 8500, degree of dispersion = 2.09] | 6.0 g |
| Bis(cyclohexylsulfonyl)diazomethane | 0.2 g |
| Bis(p-toluenesulfonyl)diazomethane | 0.1 g |
| Propylene glycol monomethyl ether acetate | 22.7 g |

Figure 5:
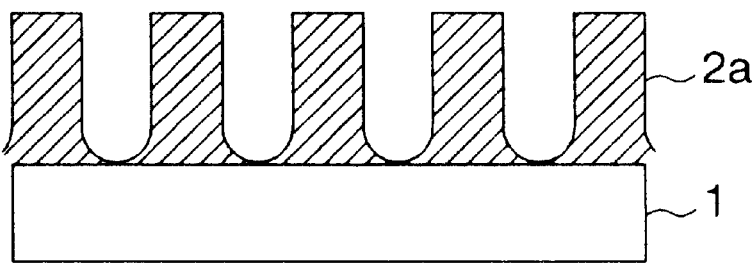
FIG. 5 is a cross-sectional view of the poor pattern with 0.30 μm L/S obtained in Comparative Example 1.
Figure 6:
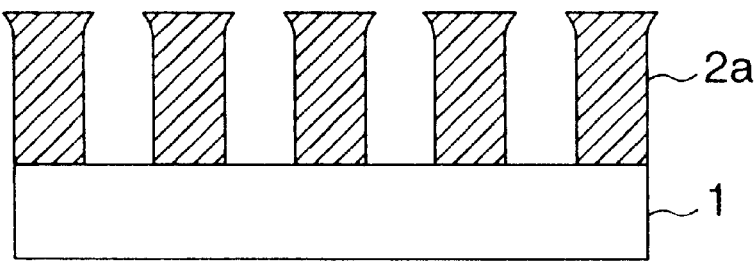
FIG. 6 is a cross-sectional view of the T-shaped positive working pattern using the resist material of obtained by Comparative Example 1.

Using the resist material mentioned above, a pattern was formed in the same manner as described in Example 1. As a result, a pattern with the line/space of 0.35 μm was resolved at an exposure dose of 35 mJ/cm$^2$, but a pattern with the line/space of 0.30 μm was not resolved as shown in FIG. 5. Further, when heat treated after 1 hour of exposure to light, T-shaped pattern as shown in FIG. 6 was formed failing to obtain a pattern with the desired good shape.

COMPARATIVE EXAMPLE 2

A resist material having the following composition was prepared.

| | |
|---|---|
| Poly(p-tert-butoxystyrene/p-hydroxy-styrene) [Mw = about 19,000, degree of dispersion = 1.87] | 6.0 g |
| Bis(cyclohexylsulfonyl)diazomethane | 0.2 g |
| Bis(p-toluenesulfonyl)diazomethane | 0.1 g |
| Propylene glycol monomethyl ether acetate | 22.7 g |

Using the resist material mentioned above, a pattern was formed in the same manner as described in Example 1. As a result, a pattern with the line/space of 0.30 μm was resolved at an exposure dose of 26 mJ/cm², but a pattern with the line/space of 0.25 μm was not resolved. Further, when heat treated after 1 hour of exposure to light, T-shaped pattern as in Comparative Example 1 was formed failing to obtain a pattern with the desired good shape.

COMPARATIVE EXAMPLE 3

A resist material having the following composition was prepared.

| | |
|---|---|
| Poly(p-tetrahydropyranyloxystyrene/p-hydroxystyrene) [Mw = about 14,700, degree of dispersion = 1.75] | 6.0 g |
| Bis(cyclohexylsulfonyl)diazomethane | 0.2 g |
| Bis(p-toluenesulfonyl)diazomethane | 0.1 g |
| Propylene glycol monomethyl ether acetate | 22.7 g |

Using the resist material mentioned above, a pattern was formed in the same manner as described in Example 1. As a result, a pattern with the line/space of 0.30 μm was resolved at an exposure dose of 26 mJ/cm², but a pattern with the line/space of 0.25 μm was not formed. Further, when heat treated after 1 hour of exposure to light, T-shaped pattern as in Comparative Example 1 was formed failing to obtain a pattern with the desired good shape.

COMPARATIVE EXAMPLE 4

A resist material having the following composition was prepared.

| | |
|---|---|
| Poly(p-1-ethoxyethoxystyrene/p-hydroxy-styrene) [Mw = about 22,000, degree of dispersion = 1.86] | 6.0 g |
| Bis(cyclohexylsulfonyl)diazomethane | 0.2 g |
| Bis(p-toluenesulfonyl)diazomethane | 0.1 g |
| Propylene glycol monomethyl ether acetate | 22.7 g |

Figure 7:
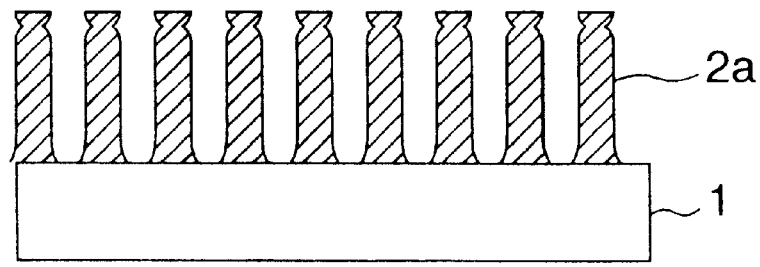
FIG. 7 is a cross-sectional view of the poor pattern with 0.20 μm L/S obtained in Comparative Example 4.
Figure 8:
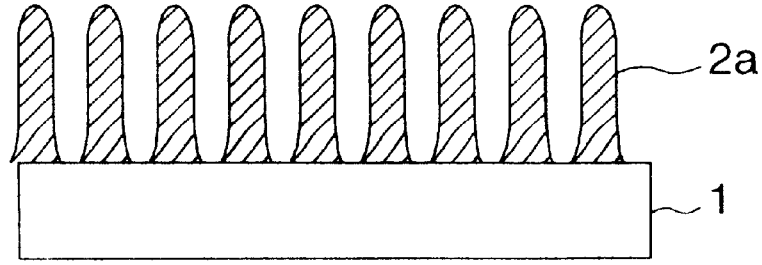
FIG. 8 is a cross-sectional view of the pattern poor in heat resistance after baked at 120° C. for 150 seconds obtained in Comparative Example 1.
Figure 9:
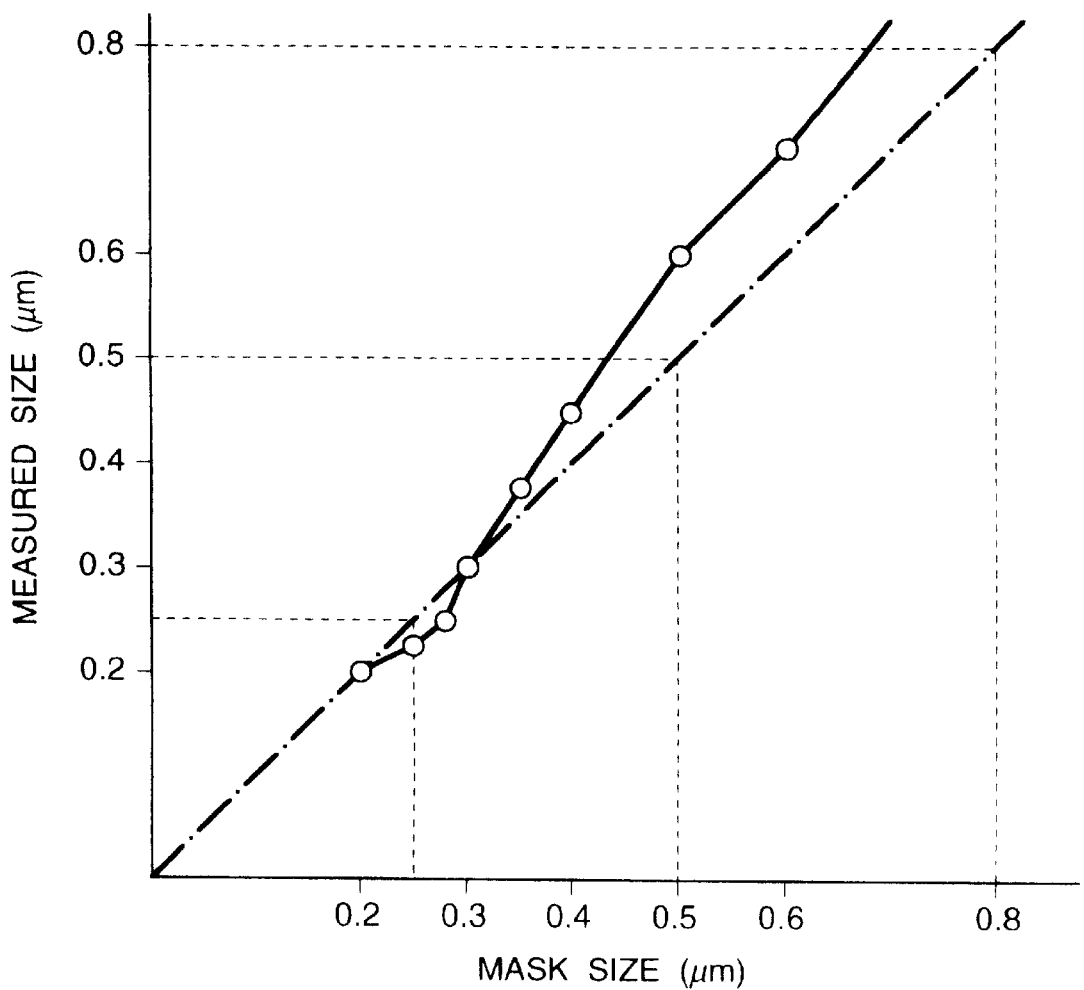
FIG. 9 is a graph showing a poor mask linearity of the resist material obtained in Comparative Example 4.
Figure 10:
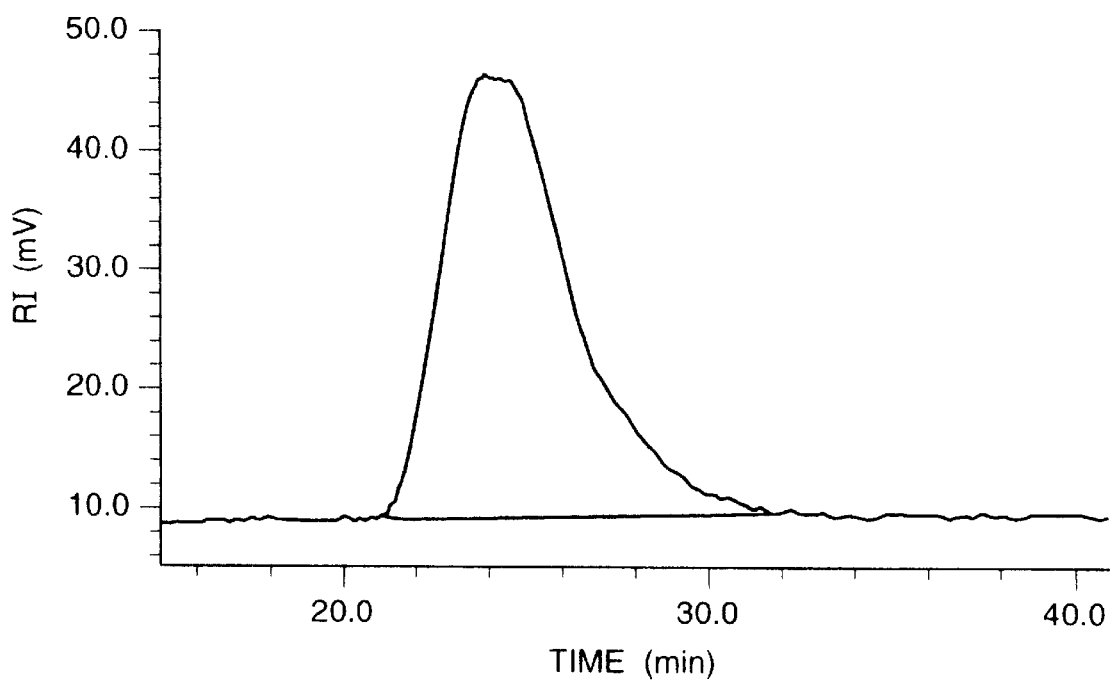
FIG. 10 is a GPC chart of the polymer used in Comparative Example 4.

Using the resist material mentioned above, a pattern was formed in the same manner as described in Example 1. As a result, a pattern with the line/space of 0.20 μm was resolved at an exposure dose of 22 mJ/cm², but the sidewalls of pattern were not good as shown in FIG. 7. When the pattern with the line/space of 0.25 μm was baked at 120° C. for 150 seconds, the pattern with the line/space of 0.25 μm was deformed as shown in FIG. 8. Further, the mask linearity was not good as shown in FIG. 9.

The poly(p-1-ethoxyethoxystyrene/p-hydroxystyrene) had Mw of about 22,000 (GPC method, polystyrene standard) and the degree of dispersion of 1.86.

COMPARATIVE EXAMPLE 5

A resist material having the following composition was prepared by using a monodisperse polymer [poly(p-tert-butoxystyrene/p-hydroxystyrene)] obtained in the same manner so described in Reference Example 1.

| | |
|---|---|
| Poly(p-tert-butoxystyrene/p-hydroxy-styrene) [Mw = about 16,000, degree of dispersion = 1.16] | 6.0 g |
| Bis(cyclohexylsulfonyl)diazomethane | 0.2 g |
| Bis(p-toluenesulfonyl)diazomethane | 0.1 g |
| Propylene glycol monomethyl ether acetate | 22.7 g |

Using the resist material mentioned above, a pattern was formed in the same manner as described in Example 1. As a result, a pattern with the line/space of 0.30 μm was resolved at an exposure dose of 26 mJ/cm², but a pattern with the line/space of 0.25 μm was not formed. Further, when heat treated after 1 hour of exposure to light, T-shaped pattern as in Comparative Example 1 was formed failing to obtain a pattern with the desired good shape.

COMPARATIVE EXAMPLE 6

A resist material having the following composition was prepared by using a monodisperse polymer [poly(p-tetrahydropyranyloxystyrene/p-hydroxystyrene)] obtained in Reference Example 2.

| | |
|---|---|
| Poly(p-tetrahydropyranyloxystyrene/p-hydroxystyrene) [Mw = about 10,000, degree of dispersion = 1.05] | 6.0 g |
| Bis(cyclohexylsulfonyl)diazomethane | 0.2 g |
| Bis(p-toluenesulfonyl)diazomethane | 0.1 g |
| Propylene glycol monomethyl ether acetate | 22.7 g |

Using the resist material mentioned above, a pattern was formed in the same manner as described in Example 1. As a result, a pattern with the line/space of 0.30 μm was resolved at an exposure dose of 26 mJ/cm², but or pattern with the line/space of 0.25 μm was not formed. Further, when heat treated after 1 hour of exposure to light, T-shaped pattern as in Comparative Example 1 was formed failing to obtain a pattern with the desired good shape.

As is clear from the results of Comparative Examples (together with FIGS. 5 to 9), when known polymers are used in resist materials, the resolution is poorer than that of the present invention, the problem of delay time is brought about, or even if the resolution may be good, the shape of sidewalls of pattern is not good, or poor in the mask linearity and heat resistance.

As mentioned above, the monodisperse polymer of the present invention is excellent in functionality. When such a polymer is used in resist materials, there can be overcome various problems such as poor resolution caused by the use of known polymers, poor sidewalls of pattern, insufficiency in the depth of focus, changes of pattern size with the lapse of time from exposure to light to heat treatment (post baking), the substrate dependency, etc. Therefore, the present invention is very effective for forming ultrafine patterns in semiconductor industry.

Further, the resist material of the present invention is effective for forming patterns using not only deep ultraviolet light and KrF excimer laser beams, but also i-line light, electron beams, soft X-rays, etc.

What is claimed is:

1. A polymer having repeating units of the formula:

[1]

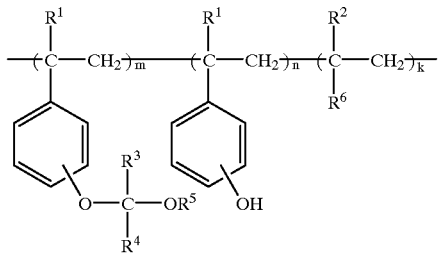

wherein $R^1$ and $R^2$ are independently a hydrogen atom or a lower alkyl group; $R^3$ and $R^4$, which cannot be both hydrogen atoms, are independently a hydrogen atom or an alkyl group which may be substituted with one or more halogen atom, or $R^3$ and $R^4$ can form an alkylene ring together with the interposing carbon atom; $R^5$ is an alkyl group which may be substituted with one or more halogen atom, or an aralkyl group; $R^6$ is a phenyl group which may have one or more substituent, a carboxyl group which may be substituted with an alkyl group, or a cyano group; m and n are independently an integer of 1 or more; k is zero or an integer of 1 or more, provided that $0.1 \leq (m+k)/(m+n+k) \leq 0.9$ and $0 \leq k/(m+n+k) \leq 0.25$, said polymer having a degree of molecular weight dispersion of 1 or more, and less than 1.5.

2. A polymer according to claim 1, wherein in the formula [1] either one of $R^3$ and $R^4$ is a hydrogen atom or a lower alkyl group and the other is a lower alkyl group; $R^5$ is a lower alkyl group; the substituent of the phenyl group in the definition of $R^6$ is a lower alkyl group, a lower alkoxy group, or $R^{22}O$—CO—$(CH_2)_jO$—; $R^{22}$ is an alkyl group; and j is zero or an integer of 1.

3. A resist material comprising the polymer of claim 1, which further comprises a photoacid generator which generates an acid by exposure to actinic radiation.

4. A resist material according to claim 3, wherein the photoacid generator is a compound of the formula:

[16]

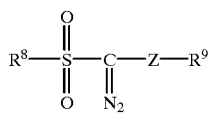

wherein $R^8$ and $R^9$ are independently an alkyl group, a haloalkyl group, or an aralkyl group; Z is —CO— or —$SO_2$—.

5. A resist material according to claim 3, wherein the photoacid generator is a compound of the formula:

[17]

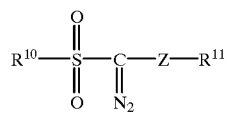

wherein $R^{10}$ is a phenyl group which may have one or more substituents; $R^{11}$ is an alkyl group, a haloalkyl group, an aralkyl group, or a phenyl group which may have one or more substituents; and Z is —CO— or —$SO_2$—.

6. A resist material according to claim 3, wherein the photoacid generator is a compound of the formula:

[18]

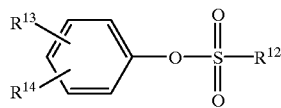

wherein $R^{12}$ is an alkyl group, a haloalkyl group or a phenyl group which may have one or more substituents; $R^{13}$ and $R^{14}$ are independently a hydrogen atom, a halogen atom, an alkyl group, a haloalkyl group or a group of the formula:

[19]

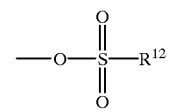

wherein $R^{12}$ is as defined above.

7. A resist material according to claim 3, wherein the photoacid generator is a compound of the formula:

[20]

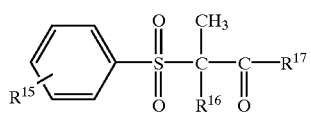

wherein $R^{15}$ is a hydrogen atom, a halogen atom, an alkyl group or a haloalkyl group; $R^{16}$ is an alkyl group; $R^{17}$ is an alkyl group, a phenyl group which may have one or more substituents, or an aralkyl group.

8. A resist material according to claim 3, wherein the photoacid generator is a compound of the formula:

[21]

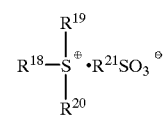

wherein $R^{18}$, $R^{19}$ and $R^{20}$ are independently an alkyl group, a phenyl group, an alkyl-substituted phenyl group, a haloalkyl group or an aralkyl group; and $R^{21}$ is a fluoroalkyl group, a phenyl group, a haloalkylphenyl group or a tolyl group.

9. A resist material accordng to claim 3, wherein the photoacid generator is a combination of at least one compound of the formula:

[16]

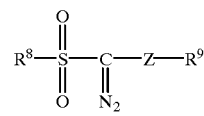

wherein $R^8$ and $R^9$ are independently an alkyl group, a haloalkyl group, or an aralkyl group; Z is —CO— or —$SO_2$—, and at least one compound selected from those represented by the formulae [17], [18], [20], [21] and [22]:

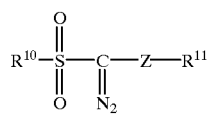
[17]

wherein $R^{10}$ is a phenyl group which may have one or more substituents; $R^{11}$ is an alkyl group, a haloalkyl group, an aralkyl group, or a phenyl group which may have one or more substituents; and Z is —CO— or —SO$_2$—,

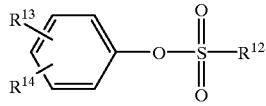
[18]

wherein $R^{12}$ is an alkyl group, a haloalkyl group or a phenyl group which may have one or more substituents; $R^{13}$ and $R^{14}$ are independently a hydrogen atom, a halogen atom, an alkyl group, a haloalkyl group or a group of the formula:

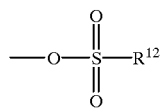
[19]

wherein $R^{12}$ is as defined above,

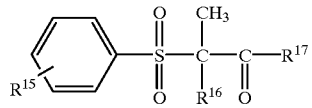
[20]

wherein $R^{15}$ is a hydrogen atom, a halogen atom, an alkyl group or a haloalkyl group; $R^{16}$ is an alkyl group; $R^{17}$ is an alkyl group, a phenyl group which may have one or more substituents, or an aralkyl group,

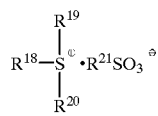
[21]

wherein $R^{18}$, $R^{19}$ and $R^{20}$ are independently an alkyl group, a phenyl group, an alkyl-substituted phenyl group, a haloalkyl group or an aralkyl group; and $R^{21}$ is a fluoroalkyl group, a phenyl group, a haloalkylphenyl group or a tolyl group, and

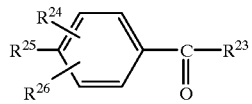
[22]

wherein $R^{24}$, $R^{25}$ and $R^{26}$ are independently a hydrogen atom, an alkylsulfonyloxy group, a haloalkylsulfonyloxy group, or a group of the formula:

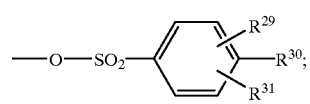
[24]

$R^{23}$ is an alkyl group or a group of the formula:

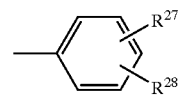
[23]

in which $R^{27}$ and $R^{28}$ are independently a hydrogen atom, a hydroxyl group, an alkylsulfonyloxy group, a haloalkylsulfonyloxy group, or a group of the formula [24], in which $R^{29}$, $R^{30}$ and $R^{31}$ are independently a hydrogen atom, a halogen atom, an alkyl group or a haloalkyl group.

10. A resist material according to claim 9, wherein the compound of the formula [16] is bis(1,1-dimethylethylsulfonyl) diazomethane, bis(1-methylethylsulfonyl) diazomethane, or bis(cyclohexylsulfonyl) diazomethane, and the compound of the formula [17] is bis(p-toluenesulfonyl) diazomethane or bis(2,4-dimethylbenzenesulfonly) diazomethane.

11. A resist material according to claim 9, wherein the compound of the formula [16] is bis(1,1-dimethylethylsulfonyl) diazomethane, bis(1-methylethylsulfonyl) diazomethane, or bis(cyclohexylsulfonyl) diazomethane, and the compound of the formula [21] is triphenylsulfonium trifluoromethanesulfonate, triphenylsulfonium perfluorooctanesulfonate, diphenyl-p-tolylsulfonium perfluorooctanesulfonate, tris(p-tolyl)sulfonium perfluorooctanesulfonate, or tris(p-tolyl)sulfonium trifluoromethanesulfonate.

* * * * *